United States Patent
Ishii et al.

(10) Patent No.: US 9,559,154 B2
(45) Date of Patent: Jan. 31, 2017

(54) DISPLAY DEVICE KEEPING A DISTANCE BETWEEN A LIGHT EMITTING LAYER AND A COUNTER SUBSTRATE UNIFORMLY

(71) Applicant: Japan Display Inc., Tokyo (JP)

(72) Inventors: Yoshinori Ishii, Tokyo (JP); Toshihiro Sato, Tokyo (JP); Toshio Tojo, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/794,434

(22) Filed: Jul. 8, 2015

(65) Prior Publication Data

US 2016/0013254 A1  Jan. 14, 2016

(30) Foreign Application Priority Data

Jul. 10, 2014 (JP) ................................ 2014-142371

(51) Int. Cl.
*H01L 29/18* (2006.01)
*H01L 27/32* (2006.01)
*H01L 51/52* (2006.01)

(52) U.S. Cl.
CPC ......... *H01L 27/3246* (2013.01); *H01L 51/525* (2013.01)

(58) Field of Classification Search
CPC ............... H01L 27/322; H01L 27/3246; H01L 27/3251; H01L 51/525; H01L 51/56
USPC ..................................... 257/88, 89, 98, 100
See application file for complete search history.

(56) References Cited

U.S. PATENT DOCUMENTS

| | | | |
|---|---|---|---|
| 2006/0135029 A1 | 6/2006 | Harada | |
| 2010/0176720 A1* | 7/2010 | Yamazaki | H01L 27/3246 313/509 |
| 2011/0084287 A1 | 4/2011 | Lee | |
| 2011/0101888 A1* | 5/2011 | Uchida | H01L 27/3246 315/312 |
| 2013/0240855 A1* | 9/2013 | Chida | H01L 51/56 257/40 |

FOREIGN PATENT DOCUMENTS

| | | |
|---|---|---|
| JP | 2006-252988 A | 9/2006 |
| KR | 10-2006-0066641 A | 6/2006 |
| KR | 10-2011-0038514 A | 4/2011 |

OTHER PUBLICATIONS

Office Action mailed on Oct. 14, 2016 for the corresponding Korean application No. 10-2015-0088906.

* cited by examiner

*Primary Examiner* — Hung Vu
(74) *Attorney, Agent, or Firm* — TYPHA IP LLC

(57) ABSTRACT

A display device includes a first substrate, pixel electrodes located in correspondence with pixels above the first substrate, a first partition covering ends of a group of the pixel electrodes, a second partition covering ends of another group of the pixel electrodes, the second partition being lower than the first partition, a solid filler located above the first partition and the second partition, and a second substrate facing the first substrate, the second substrate being away from the first substrate by a distance kept by the first partition, the second partition and the filler.

5 Claims, 17 Drawing Sheets

FIG. 11
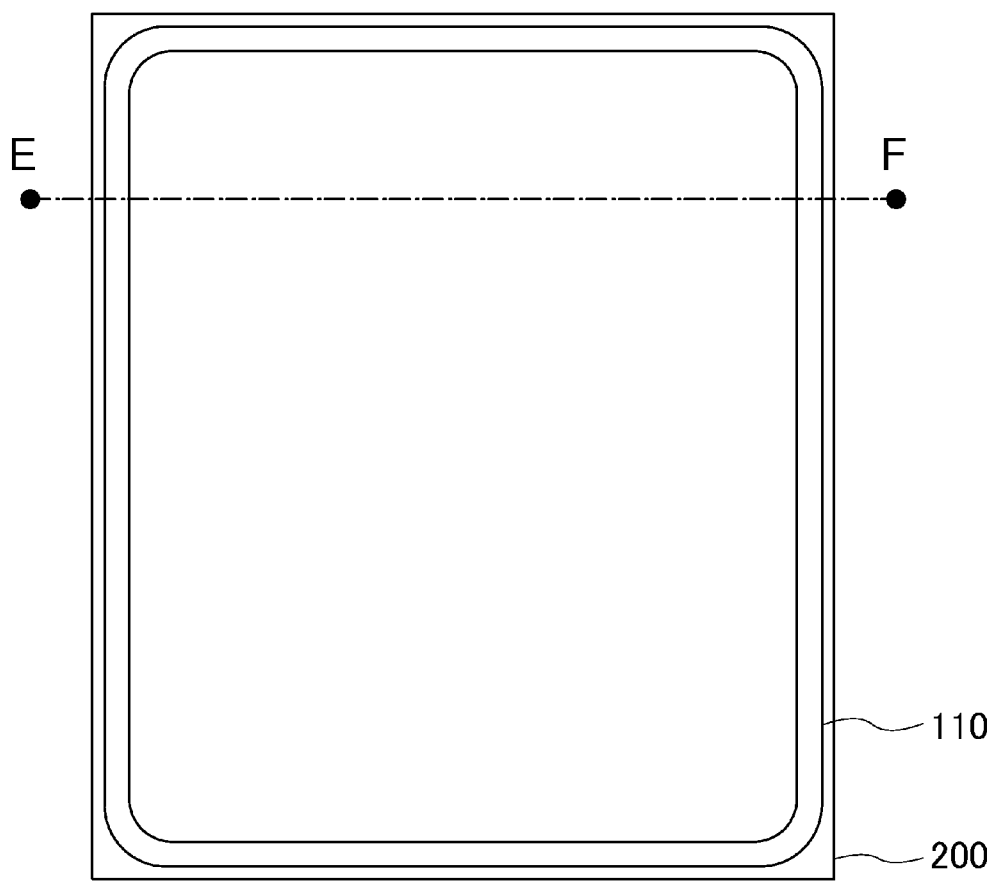
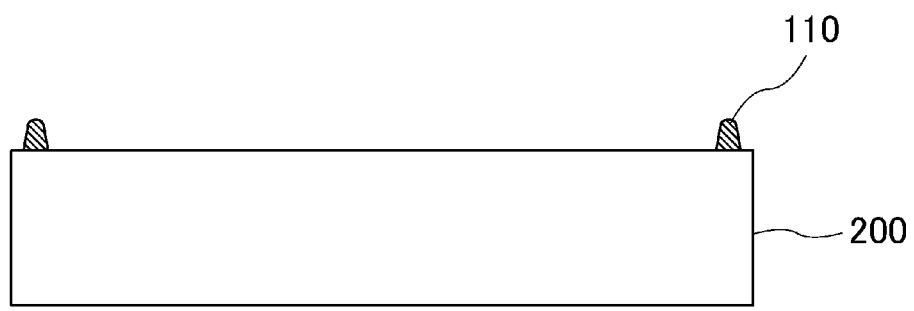

FIG. 12
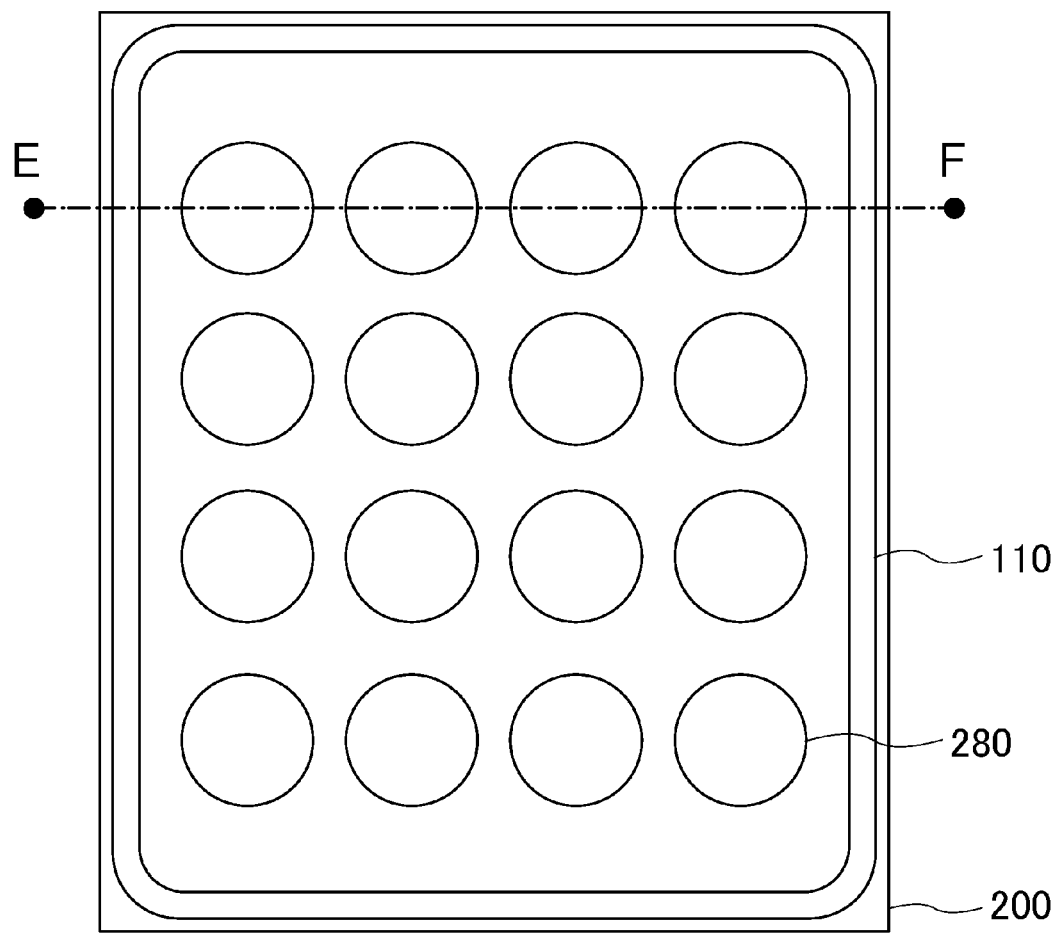
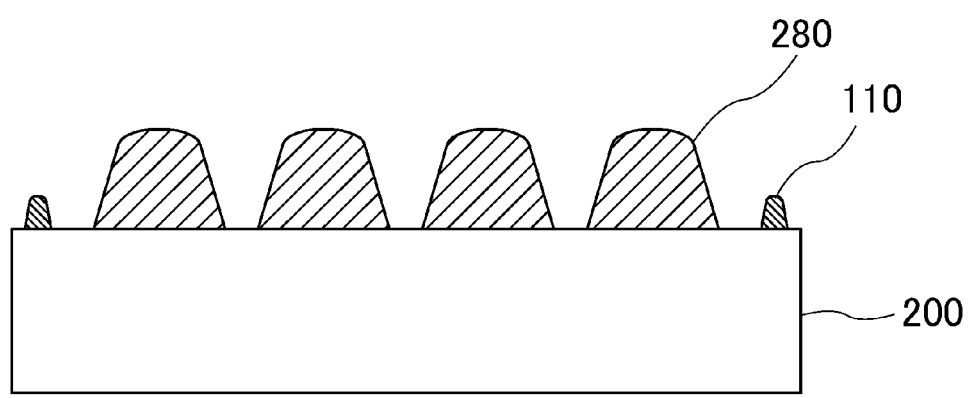

FIG. 13
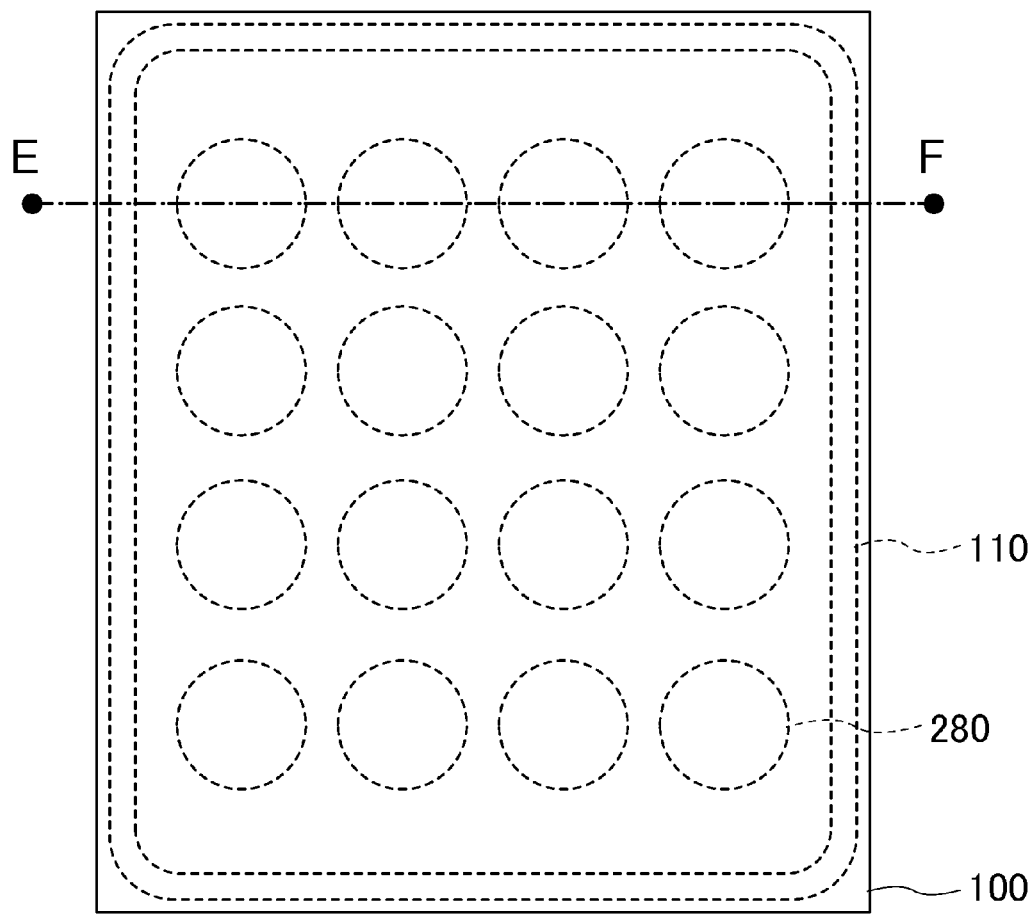
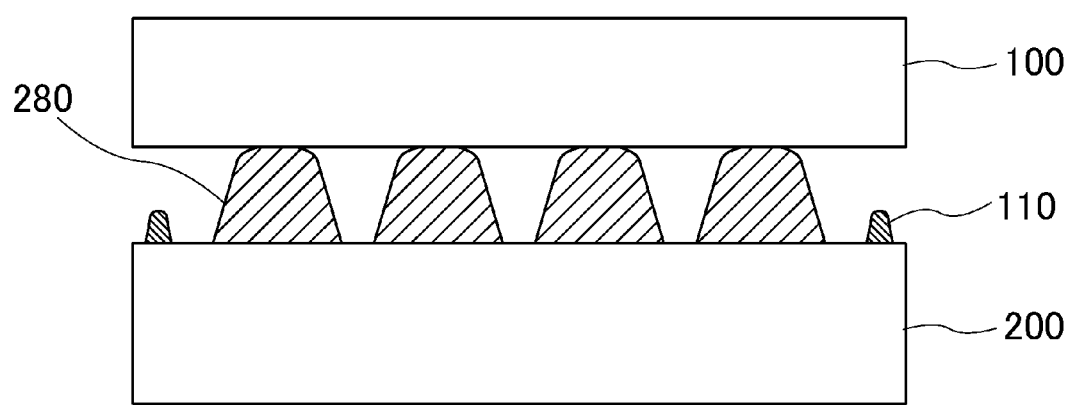

FIG. 14
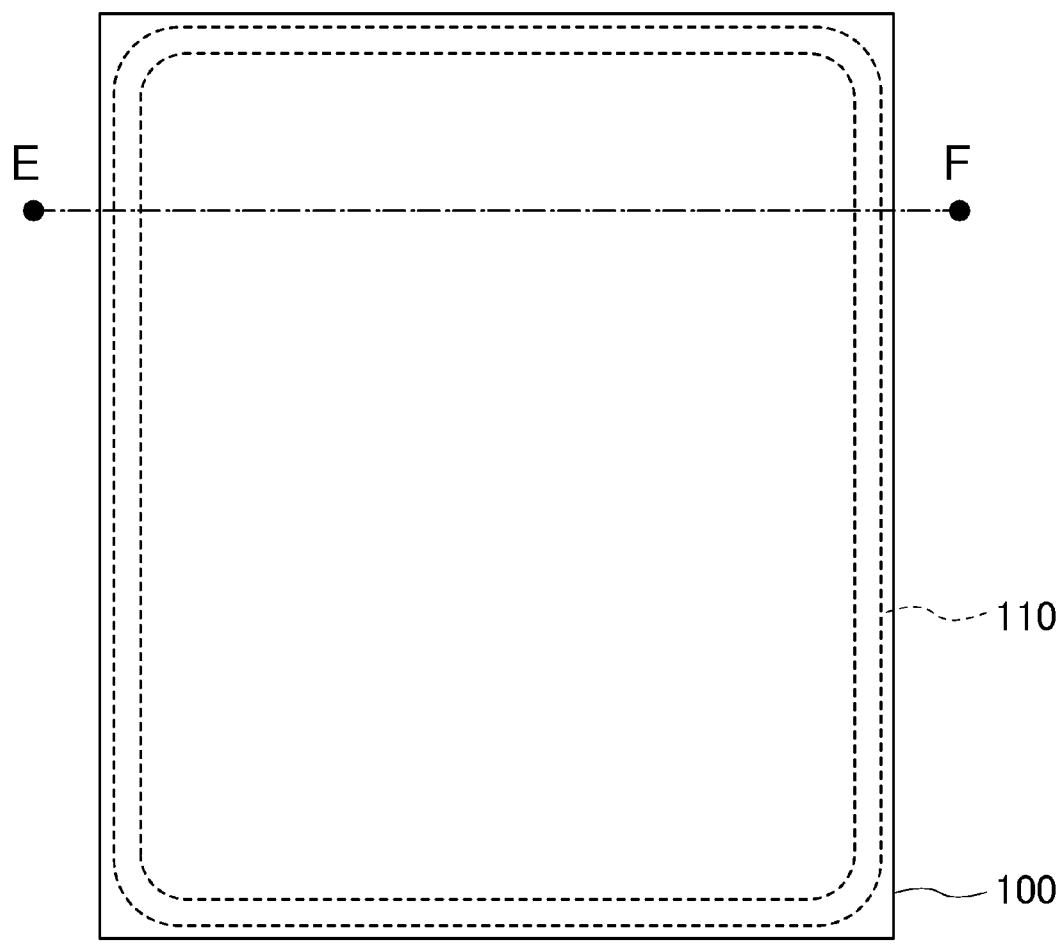
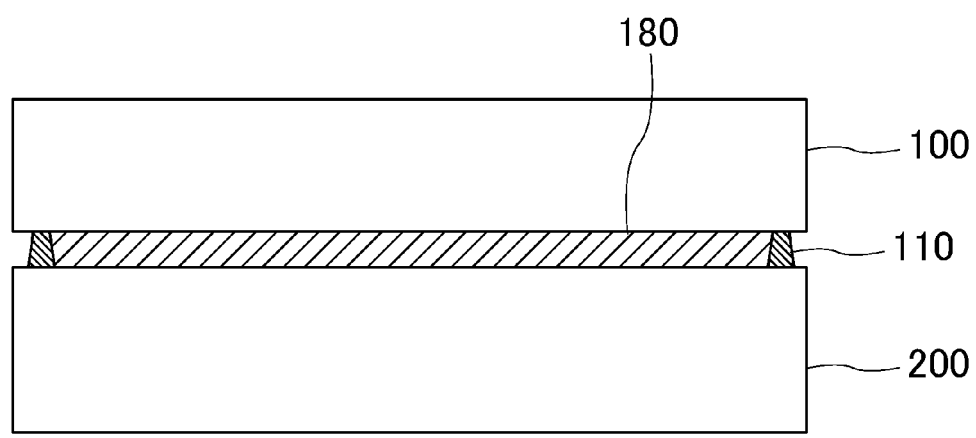

FIG. 15
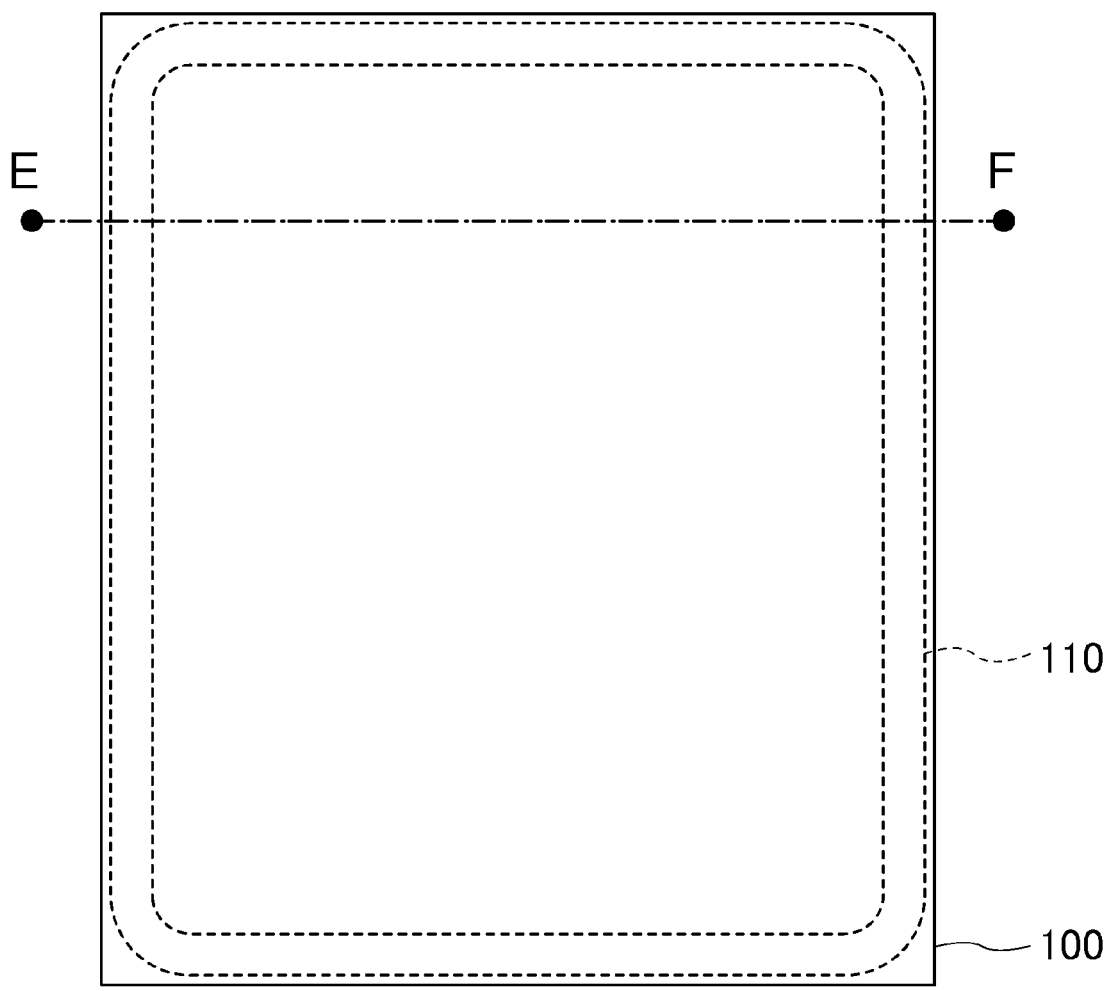
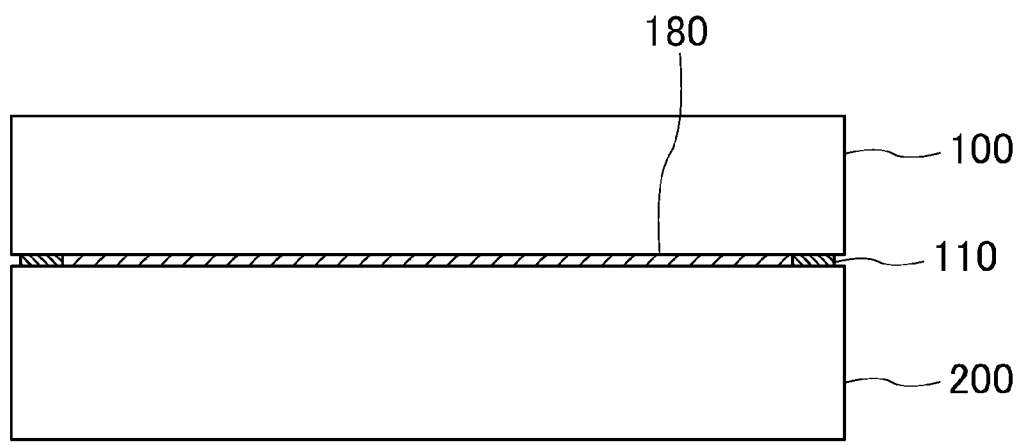

DISPLAY DEVICE KEEPING A DISTANCE BETWEEN A LIGHT EMITTING LAYER AND A COUNTER SUBSTRATE UNIFORMLY

CROSS-REFERENCE TO RELATED APPLICATIONS

This application is based upon and claims the benefit of priority from the prior Japanese Patent Application No. 2014-142371, filed on Jul. 10, 2014, the entire contents of which are incorporated herein by reference.

FIELD

The present invention relates to a display device and a manufacturing method of a display device. An embodiment disclosed herein relates to a structure between substrates assembled together.

BACKGROUND

Recently, display devices for uses in mobile devices are increasingly strongly desired to have higher definition and consume less power. Examples of display devices for uses in mobile devices are liquid crystal display devices (LCDs), display devices using light emitting elements, for example, organic light-emitting diode (OLED) display devices, electronic paper display devices, and the like.

Organic light-emitting diode display devices and electronic paper display devices, among the above, do not require a backlight unit or a polarization plate, which is required in liquid crystal display devices. These display devices are a target of attention as thin light emitting display devices consuming low power. Especially, top emission-type organic EL display devices using white light emitting elements and color filters for light emission to realize full-color display have been progressively developed. Such top emission-type organic EL display devices realize both of a higher numerical aperture of pixels and higher definition, and therefore attract a significant attention.

It is known regarding a high-definition top emission-type organic EL display device that in the case where the distance between a light emitting layer and a counter substrate is different among a plurality of pixels, non-uniform display is caused by a difference in the optical path length. In order to suppress the non-uniform display, a technology of locating spacers between an array substrate having a light emitting layer and a transistor layer formed thereon, and the counter substrate, has been developed (e.g., Japanese Laid-Open Patent Publication No. 2006-252988). In the case where the spacers have a height equal to, or larger than, the thickness of a filler located between the array substrate and the counter substrate, the distance between the array substrate and the counter substrate is controllable by adjusting the height of the spacers.

In the meantime, when the filler located between the array substrate and the counter substrate is thick in a high-definition display device, there occurs a problematic phenomenon that light emitted from the light emitting layer passes an adjacent pixel to be output outside (light leak between adjacent pixels). Especially in a structure in which color filters are located on the side of the counter substrate, colors are mixed due to the light leak between the adjacent pixels. In order to suppress such color mixing, the distance between the light emitting layer and the color filters needs to be shortened. For example, a structure of using partitions demarcating the pixels and a filler as spacers, instead of using conventionally used spacers, has been developed. In the case of this structure, the spacers and the filler located on the spacers are held between the array substrate and the counter substrate. The height of the spacers and the thickness of the filler need to be controlled to be uniform in a planar direction of the substrates.

SUMMARY

A display device in an embodiment according to the present invention includes a first substrate, pixel electrodes located in correspondence with pixels above the first substrate, a first partition covering ends of a group of the pixel electrodes, a second partition covering ends of another group of the pixel electrodes, the second partition being lower than the first partition, a solid filler located above the first partition and the second partition, and a second substrate facing the first substrate, the second substrate being away from the first substrate by a distance kept by the first partition, the second partition and the filler.

In another embodiment, an area of the filler over the second partition may be thicker than an area of the filler over the first partition.

In still another embodiment, the first partition may be located inner and outer to the second partition.

In still another embodiment, the second partition may be located in an annular shape.

In still another embodiment, the display device may further include a sealing member located around the filler.

In still another embodiment, the second partition may be located along the sealing member.

In still another embodiment, the display device may further include color filters located between the filler and the second substrate in correspondence with the pixels, the color filters each transmitting light of a particular wavelength. Adjacent color filters among the color filters may transmit light of different wavelengths.

In still another embodiment, a light blocking layer may be located between adjacent pixels among the pixels.

In still another embodiment, the pixels may output white light.

A manufacturing method of a display device in an embodiment according to the present invention includes forming pixel electrodes above a first substrate in correspondence with pixels, forming a first partition covering ends of a group of the pixel electrodes, forming a second partition covering ends of another group of the pixel electrodes, the second partition being lower than the first partition, forming a filler above the second substrate, and assembling the first substrate and the second substrate together by use of the first partition, the second partition and the filler such that a distance between the first substrate and the second substrate is kept.

In another embodiment, the first partition and the second partition may be formed in the same step as each other.

In still another embodiment, the first partition and the second partition may be formed by use of a gradation mask.

In still another embodiment, the filler may be positionally adjusted such that an area of the filler corresponding to the second filler is thicker than an area of the filler corresponding to the first filler in a state where the first substrate and the second substrate are assembled together.

BRIEF DESCRIPTION OF DRAWINGS

FIG. 11 shows a step of applying a sealing member to the counter substrate as a part of the step of assembling the array substrate and the counter substrate to form the display device in embodiment 1 according to the present invention;

FIG. 12 shows a step of applying a filler to the counter substrate as a part of the step of assembling the array substrate and the counter substrate to form the display device in embodiment 1 according to the present invention;

FIG. 13 shows a step of assembling the array substrate and the counter substrate in vacuum as a part of the step of assembling the array substrate and the counter substrate to form the display device in embodiment 1 according to the present invention; FIG. 14 shows a step of pressing the array substrate and the counter substrate to each other to expand the filler as a part of the step of assembling the array substrate and the counter substrate to form the display device in embodiment 1 according to the present invention;

FIG. 15 shows a step of pressing the array substrate and the counter substrate to each other at an atmospheric pressure as a part of the step of assembling the array substrate and the counter substrate to form the display device in embodiment 1 according to the present invention;

DESCRIPTION OF EMBODIMENTS

Figure 1:
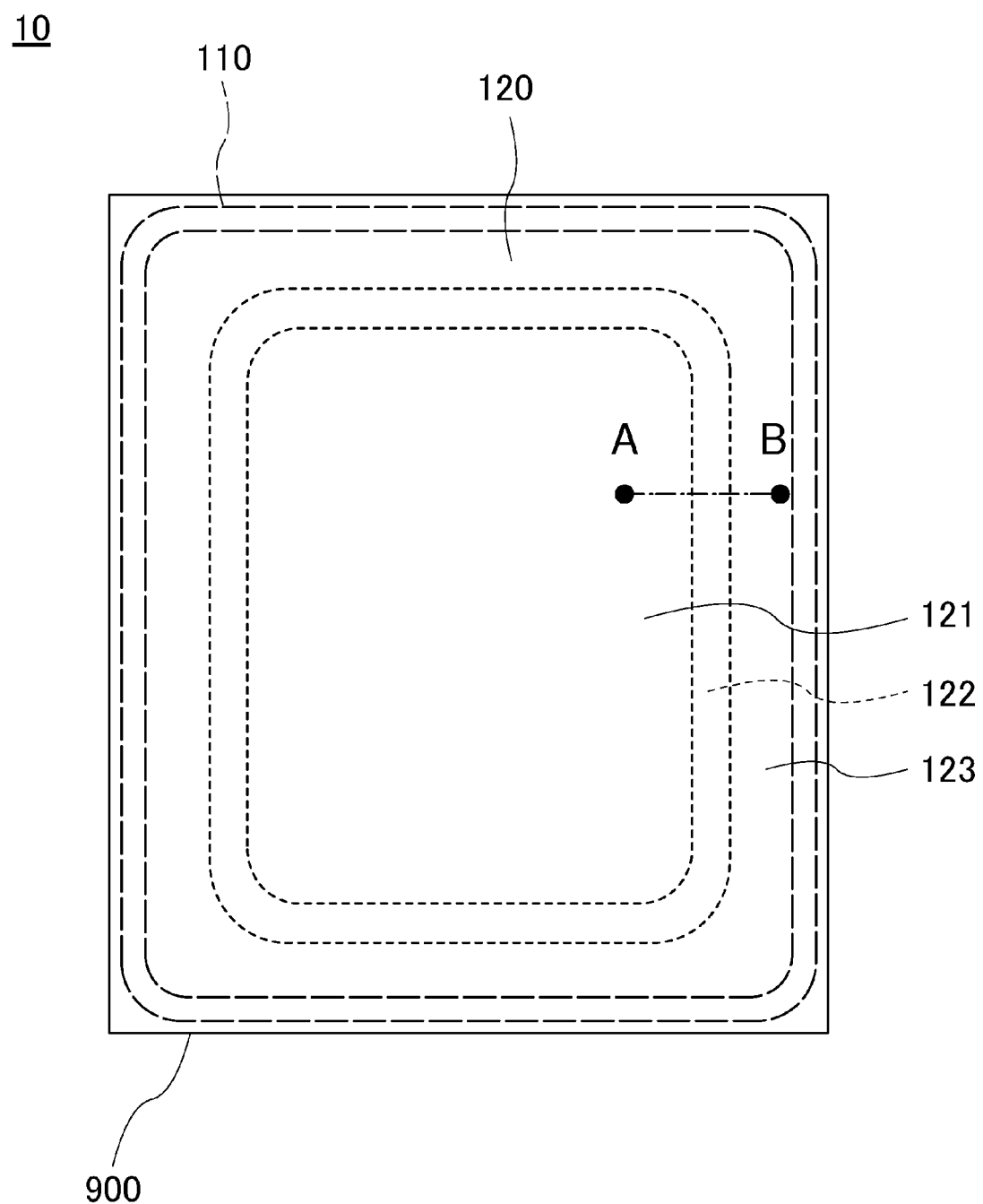
FIG. 1 is a plan view of a display device in embodiment 1 according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

Embodiment 1

Structure of a Display Device 10 in Embodiment 1

Figure 2:
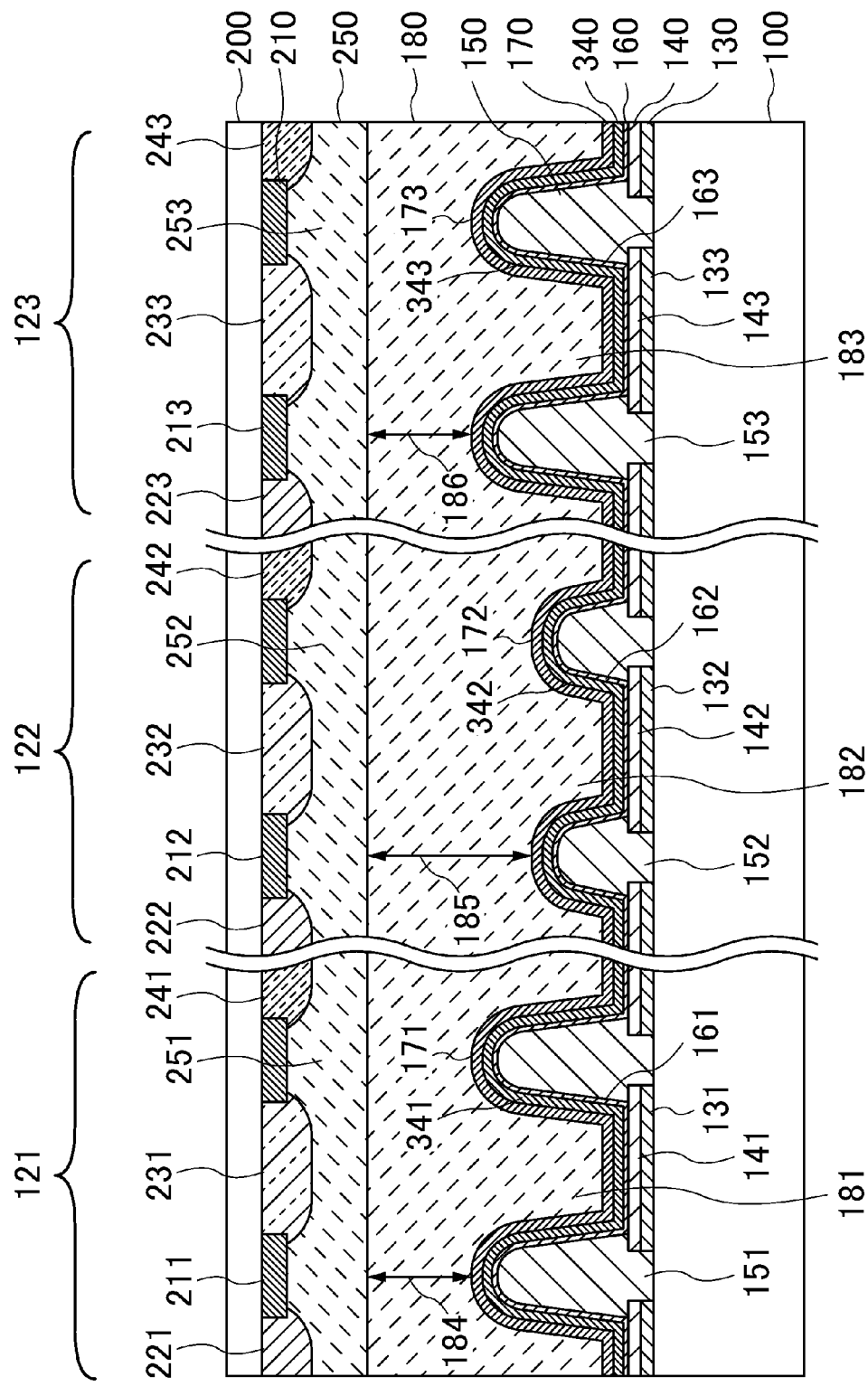
FIG. 2 is a cross-sectional view of the display device in embodiment 1 according to the present invention, taken along line A-B in FIG. 1.

With reference to FIG. 1 and FIG. 2, a structure of a display device 10 in embodiment 1 according to the present invention will be described. The display device 10 in embodiment 1 is a top emission-type organic EL display device. A structure of keeping the distance between an array substrate 100 and a counter substrate 200 by use of partitions and a filler will be described.

FIG. 1 is a plan view of the display device 10 in embodiment according to the present invention. As shown in FIG. 1, the display device 10 includes a substrate assembly 900 formed of the array substrate 100 and the counter substrate 200 assembled together, a sealing member 110 provided along a periphery of the substrate assembly 900, and a filler 120 located inside the sealing member 110. In other words, the display device 10 includes the sealing member 110 located around the filler 120. Referring to FIG. 2, an area of the display device 10 between the array substrate 100 and the counter substrate 200 is divided into a first area 121, a second area 122 and a third area 123 from an inner area to an outer area of the substrate assembly 900. In FIG. 1, the first area 121, the second area 122 and the third area 123 are separated from each other along borders (dotted lines). It should be noted that the borders between these areas do not need to be clear. With reference to FIG. 2, a structural difference among the first through third areas 121 through 123 will be described in detail.

In embodiment 1, the display device 10 may be produced by a method according to which the sealing member 110 and the filler 120 are formed on the array substrate 100 or the counter substrate 200, and then the array substrate 100 and the counter substrate 200 are assembled together. In the case where the display device 10 is produced by this method, there occurs a problem that the filler 120 in the second area 122 is made thicker than the filler 120 in the first area 121 and the third area 123.

FIG. 2 is a cross-sectional view of the display device 10 in embodiment 1 according to the present invention, taken along line A-B in FIG. 1. As shown in FIG. 2, the display device 10 includes the array substrate 100 and the following elements provided above the array substrate 100: transistor layers 130 and pixel electrodes 140 that are located in correspondence with a plurality of pixels, partitions 150 that demarcate the pixels and cover ends of the pixel electrodes 140, a light emitting layer 160 that is located above the pixel electrodes 140 and the partitions 150 and emits light, a common electrode 340 that supplies power to the light emitting layer 160, a protective layer 170 that is located above the light emitting layer 160 and the common electrode 340 and has a low moisture permeability level, a solid filler 180 located on the protective layer 170 (i.e., above the partitions 150), and a counter substrate 180 that faces the array substrate 100 and is kept distanced from the array substrate 100 by the partitions 150 and the filler 180. In FIG. 2, located on the counter substrate 200 are a light blocking layer 210 located between adjacent pixels, color filters (B) 220 (221, 222, 223), color filters (G) 230 (231, 232, 233) and color filters (R) 240 (241, 242, 243) that are respectively located in correspondence with the pixels, and an overcoat layer 250 that covers the light blocking layer 210 and the color filters 220, 230 and 240. The color filters 220, 230 and 240 each transmit light of a particular wavelength. In this specification, when an element is expressed as being located "above" or "on" another element, it is not necessarily intended to describe the first element and the second element are in contact with each other or are out of contact with each other. In addition, when an element is expressed as being located "above" another element, it is not necessarily intended to describe the first element is at an upper position than the second element in the paper sheets of the cross-sectional views.

The overcoat layer 250 alleviates unevenness caused by the light blocking layer 210 and the color filters 220, 230 and 240 that are formed on the counter substrate 200 (in FIG. 2, formed on a surface of the counter substrate 200 facing the array substrate 100). Namely, the overcoat layer 250 flattens a top surface on the side of the counter substrate 200 in a pre-assembly state.

Herein, the transistor layers 130 located in the first area 121, the second area 122 and the third area 123 are respectively referred to as transistor layers 131, 132 and 133. The pixel electrodes 140 located in the first area 121, the second area 122 and the third area 123 are respectively referred to as pixel electrodes 141, 142 and 143. The partitions 150 located in the first area 121, the second area 122 and the third area 123 are respectively referred to as partitions 151, 152 and 153. Areas of the light emitting layer 160 that are in the first area 121, the second area 122 and the third area 123 are respectively referred to as light emitting layers 161, 162 and 163. Areas of the common electrode 340 that are in the first area 121, the second area 122 and the third area 123 are respectively referred to as common electrodes 341, 342 and 343. Areas of the protective layer 170 that are in the first area 121, the second area 122 and the third area 123 are respectively referred to as protective layers 171, 172 and 173. Areas of the filler 180 that are in the first area 121, the second area 122 and the third area 123 are respectively referred to as fillers 181, 182 and 183. A thickness of the filler 181 above the partitions 151 in the first area 121 is referred to as a filler thickness 184, a thickness of the filler 182 above the partitions 152 in the first area 122 is referred to as a filler thickness 185, and thickness of the filler 183 above the partitions 153 in the first area 123 is referred to as a filler thickness 186.

Areas of the light blocking layer 210 in the first area 121, the second area 122 and the third area 123 are respectively referred to as light blocking layers 211, 212 and 213. The color filters (B) 220 located in the first area 121, the second area 122 and the third area 123 are respectively referred to as color filters 221, 222 and 223. The color filters (G) 230 located in the first area 121, the second area 122 and the third area 123 are respectively referred to as color filters 231, 232 and 233. The color filters (R) 240 located in the first area 121, the second area 122 and the third area 123 are respectively referred to as color filters 241, 242 and 243. Areas of the overcoat layer 250 that are in the first area 121, the second area 122 and the third area 123 are respectively referred to as overcoat layers 251, 252 and 253.

The partitions 152 are lower than the partitions 151 and 153. The filler thickness 185 is greater than the filler thicknesses 184 and 186. As described above, the partitions and the fillers in the first through third areas have different heights. Thus, top surfaces of the fillers 181, 182 and 183 (surfaces in contact with the overcoat layer 250) are at substantially the same level.

The partitions 151 and 153 are substantially the same as each other in the cross-sectional shape and the planar shape, and thus do not need to be distinguished from each other. Namely, the partitions 151 and 153 may be collectively referred to as a "first partition". The partitions 152 lower than the partitions 151 and 153 may be referred to as a "second partition". The fillers 181 and 183 are formed to have substantially the same thickness as each other, and thus do not need to be distinguished from each other. Namely, the fillers 181 and 183 may be collectively referred to as a "first filler". The filler 182 thicker than the fillers 181 and 183 may be referred to as a "second filler".

Between the array substrate 100 and the transistor layers 130, a barrier layer that suppresses impurities in the array substrate 100 from being dispersed to the transistor layers 130 may be located. The barrier layer may be formed of a silicon nitride film ($SiN_x$ film), a silicon oxide film ($SiO_x$ film), a silicon nitride oxide film ($SiN_xO_y$ film), a silicon oxide nitride film ($SiO_xN_y$ film), an aluminum nitride film ($AlN_x$ film), an aluminum oxide film ($AlO_x$ film), an aluminum nitride oxide film ($AlN_xO_y$ film), an aluminum oxide nitride film ($AlO_xN_y$ film), or the like (x and y each represent an arbitrary value). These film may be stacked to form a stacking structure.

For the transistor layers 130, a transistor having a common structure is usable. For example, a bottom gate-type transistor or a top gate-type transistor using, for a channel layer, amorphous silicon, polysilicon, single crystalline silicon, oxide semiconductor, organic semiconductor or the like may be used.

For the pixel electrodes 140, a common conductive material is usable. Since the display device 10 in embodiment 1 is a top emission-type organic EL display device, a material having a high reflectance is usable for the pixel electrodes 140. For example, aluminum (Al), titanium (Ti), molybdenum (Mo), chromium (Cr), nickel (Ni), silver (Ag), or an alloy thereof may be used. Alternatively, films of the above-described materials may be stacked to form a stacking structure.

In embodiment 1, the transistor layers 130 and the pixel electrodes 140 are shown as having the same planar shape for the sake of convenience. It should be noted that the transistor layers 130 and the pixel electrodes 140 are not limited to having the same planar shape. Namely, the transistor layers 130 and the pixel electrodes 140 may have different planar shapes. For example, the pixel electrodes 140 may be formed in an area where the transistor layers 130 are not formed.

The light emitting layer 160 is formed of a material that emits white light. The light emitted from the light emitting layer 160 passes the color filters (B) 220, the color filters (G) 230 and the color filters (R) 240. The light components which have passed the color filters (B) 220, the color filters (G) 230 and the color filters (R) 240 are respectively recognized by a user as blue light, green light and red light. As described above, in the display device 10, the light components which have passed the color filters in adjacent pixels have different wavelengths from each other.

The light emitting layer 160 emitting white light may be formed of a single organic EL layer or may be a stack of a plurality of organic EL layers. The stack of a plurality of organic EL layers may be, for example, a stack of an organic EL layer emitting blue light and an organic EL layer emitting yellow light, or a stack of an organic EL layer emitting blue light, an organic EL layer emitting green light and an organic EL layer emitting red light. The light emitting layer 160 is not limited to having to any of the above-described structures, and may be a stack of a plurality of organic EL layers emitting light of a plurality of colors so as to emit white light. Herein, the "white light" may be light having at least a wavelength of blue light, a wavelength of green light and a wavelength to of red light, and is not limited to being white in a strict sense.

The common electrode 340 in a top emission-type organic EL display device as in embodiment 1 may be formed of a highly light-transmissive conductive material. Usable as a highly light-transmissive conductive material include, for example, ITO (indium tin oxide), ZnO (zinc oxide), IZO (composite material of indium tin oxide and zinc oxide), and the like.

The protective layer 170 is located to cover at least the light emitting layer 160, and may be formed of a material having a high blocking capability against moisture and impurities. The protective layer 170 may be formed of, for example, an $SiN_x$ film, an $SiO_x$ film, an $SiN_xO_y$ film, an $SiO_xN_y$ film, a $AlN_x$ film, an $AlO_x$ film, an $AlN_xO_y$ film, an $AlO_xN_y$ film, or the like (x and y each represent an arbitrary value), like the barrier layer which may be located between the array substrate 100 and the transistor layers 130. The protective layer 170 may be a stack of any of these films.

The light blocking layer 210 may be formed of a metal material such as Cr or the like, or a resin material colored black. The light blocking layer 210 is located in a display area in which the pixels are located and in a peripheral area in which a driving circuit is located. In an area which demarcates the pixels in the display area, the light blocking layer 210 is located to overlap lines, transistors or the like. In the peripheral area, the light blocking layer 210 is located between the display area and the sealing member 110.

In the above description, light of the three RGB colors passing the respective pixels is recognized by the user. The present invention is not limited to having such a structure. For example, light of the three RGB colors and white (W) passing the respective pixels may be recognized by the user. The pixels through which white light (W) passes may not include a color filter or the like or may include a filter adjusting the chromaticity of the white light. In the example shown in FIG. 2, the colors filters 220, 230 and 240 do not overlap each other. The present invention is not limited to having such a structure. For example, parts (ends) of the color filters of the three RGB colors may overlap each other. For example, a part of the color filter 220 and a part of the color filter 230 may overlap each other on the light blocking layer 210.

In the example shown in FIG. 2, the color filters 220, 230 and 240 are located on the light blocking layer 210 so as to face the array substrate 100. The present invention is not limited to having such a structure. For example, the light blocking layer 210 may be located on the color filters 220, 230 and 240 so as to face the array substrate 100. Alternatively, another layer may be located between the counter substrate 200 and the light blocking layer 210, or between the counter substrate 200 and the color filters 220/230/240. Still alternatively, another layer may be located between the light blocking layer 210 and the color filters 220/230/240. The color filters are provided in at least three colors as the color filters 220, 230 and 240, and the light blocking layer 210 may be located between any of the three types of color filters. For example, the color filters (R) 240 and the color filters (G) 230 may be located on the counter substrate 200 and the light blocking layer 210 may be located on the color filters (R) 240 and the color filters (G) 230, whereas the color filters (B) 220 may be located on the light blocking layer 210.

On the overcoat layer 250, a protective film may be located to block gas or moisture, which would otherwise deteriorate the light emitting elements. The protective film may be formed of an $SiN_x$ film, an $SiO_x$ film, an $SiN_xO_y$ film, an $SiO_xN_y$ film, a $AlN_x$ film, an $AlO_x$ film, an $AlN_xO_y$ film, an $AlO_xN_y$ film, or the like (x and y each represent an arbitrary value), like the barrier layer which may be located between the array substrate 100 and the transistor layers 130. The protective layer 170 may be a stack of any of these films.

Now, with reference to FIG. 1 and FIG. 2, locations of the partitions 151, 152 and 153 will be described. As shown in FIG. 1 and FIG. 2, the partitions 151 and the filler 181 are located in the first area 121, which is inner to the area 122 where the partitions 152 and the filler 182 are located. The partitions 153 and the filler 183 are located in the third area 123, which is outer to the area 122. As described above, the partitions 151 and 153 may be collectively referred to as the "first partition", whereas the partitions 152 may be referred to as the "second partition". The fillers 181 and 183 may be collectively referred to as the "first filler", whereas the filler 182 may be referred to as the "second filler". In this case, the first partition and the first filler may be expressed as being located in the first area 121 and the third area 123, which are respectively inner and outer to the second area 122 where the second partition and the second filler are located.

As shown in FIG. 1 and FIG. 2, the partitions 152 and the filler 182 may be expressed as being located in the second area 122 in an annular shape. In other words, the partitions 152 and the filler 182 may be expressed as being located along the sealing member 110.

As described above, in the display device 10 in embodiment 1, the distance between the light emitting layer 160 and the counter substrate 200 is kept uniform in all of the first area 121, the second area 122 and the third area 123. Namely, the length of the optical path from the light emitting layer 160 generating the light to a rear surface of the counter substrate 200 at which the light is output to the outside of the display device 10 is substantially uniform in a planar direction of the substrates. This suppresses non-uniform display from being caused. In a high-precision display device including partitions and a filler as spacers in order to suppress color mixing, a distribution of thickness of the filler 180, even if caused in the planar direction of the substrates, is alleviated by adjusting the height of the partitions 150 by the above-described structure. Thus, the non-uniform display is suppressed.

[Method for Producing the Display Device 10 in Embodiment 1]

Figure 3:
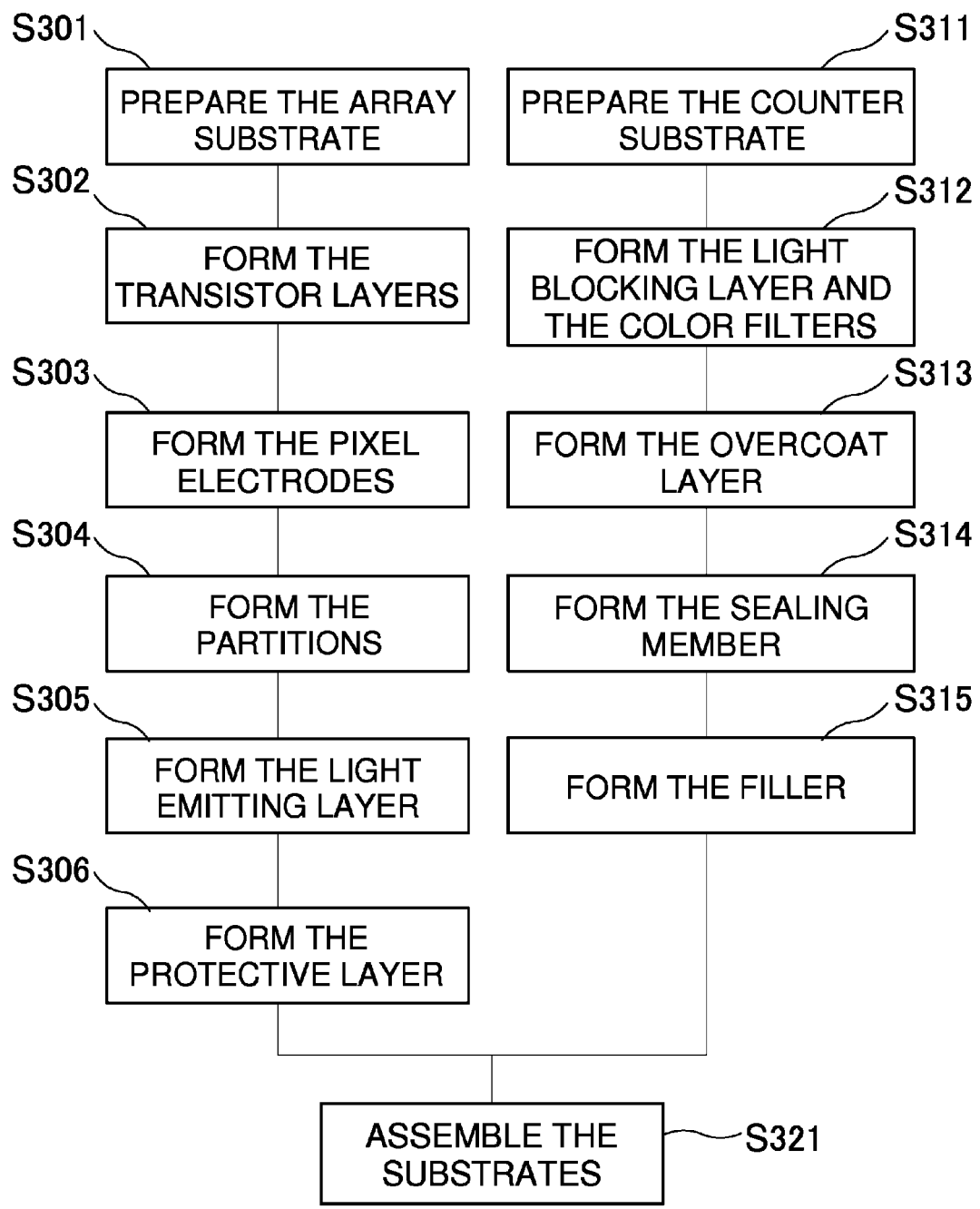
FIG. 3 is a flowchart showing a method for producing the display device in embodiment 1 according to the present invention.

With reference to FIG. 3 through FIG. 10, a method for producing the display device 10 in embodiment 1 according to the present invention will be described. FIG. 3 is a flowchart of the method for producing the display device 10 in embodiment 1 according to the present invention. FIG. 4 through FIG. 10 are cross-sectional views in steps S301 through S306, S311 through S315, and S321 shown in FIG. 3. Hereinafter, with reference to FIG. 4 through FIG. 10, each of steps shown in FIG. 3 will be described.

Figure 4:
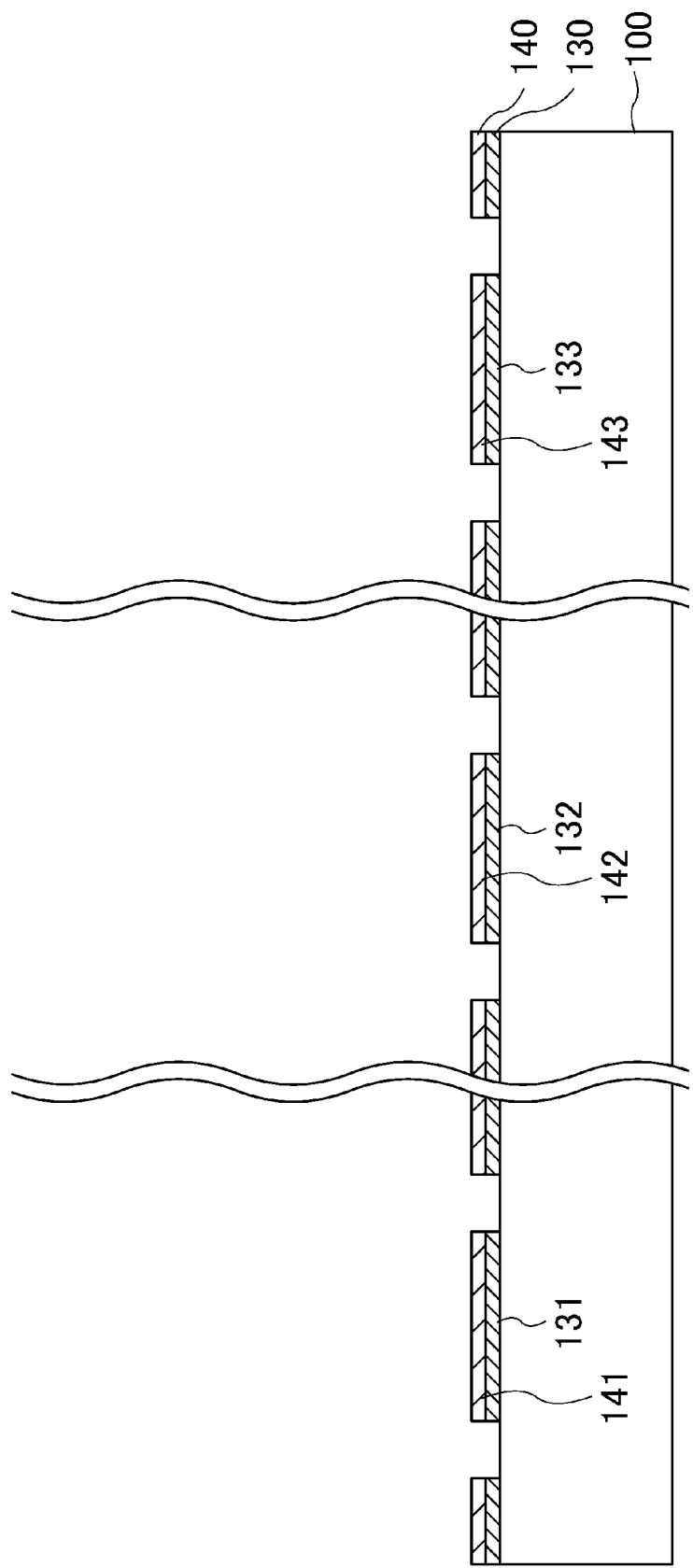
FIG. 4 shows a step of forming transistor layers and pixel electrodes on an array substrate in the method for producing the display device in embodiment 1 according to the present invention.

First, with reference to FIG. 4 through FIG. 8, a method for producing the elements on the side of the array substrate 100 will be described. FIG. 4 shows a step of forming the transistor layers 130 and the pixel electrodes 140 on the array substrate 100 in the method for producing the display device 10 in embodiment 1 according to the present invention. As shown in FIG. 4, the array substrate 100 is prepared (step S301). On the array substrate 100, the transistor layers 130 (transistor layers 131, 132 and 133) are formed (step S302). On the transistor layers 130, the pixel electrodes 140 (pixel electrodes 141, 142 and 143) are formed (step S303).

The pixel electrodes 140 are formed as follows. A conductive layer is formed on the entirety of the surface below, areas of the conductive layer that are to be left are covered with a resist, and the rest of the conductive layer is etched away. For the etching, an appropriate method may be selected in accordance with the material of the pixel electrodes 140. In the case where the conductive layer is formed of aluminum, wet etching may be performed by use of an etchant based on phosphoric acid or acetic acid. In the case where the conductive layer is formed of titanium, dry etching may be performed by use of chlorine-based gas or fluorine-based gas. With either etching method, it is preferable that the etching is performed at a high etching rate ratio of the pixel electrodes 140 and the layer below the pixel electrodes 140. It should be noted that the etching rate ratio does not need to be high. For example, etching may performed at a low etching rate ratio at which the layer below the pixel electrodes 140 may be over-etched.

In embodiment 1, the transistor layers 130 and the pixel electrodes 140 are shown as having the same planar shape for the sake of convenience. It should be noted that the transistor layers 130 and the pixel electrodes 140 are not limited to having the same planar shape. Namely, the transistor layers 130 and the pixel electrodes 140 may have different planar shapes. For example, the pixel electrodes 140 may be formed in an area where the transistor layers 130 are not formed.

Figure 5:
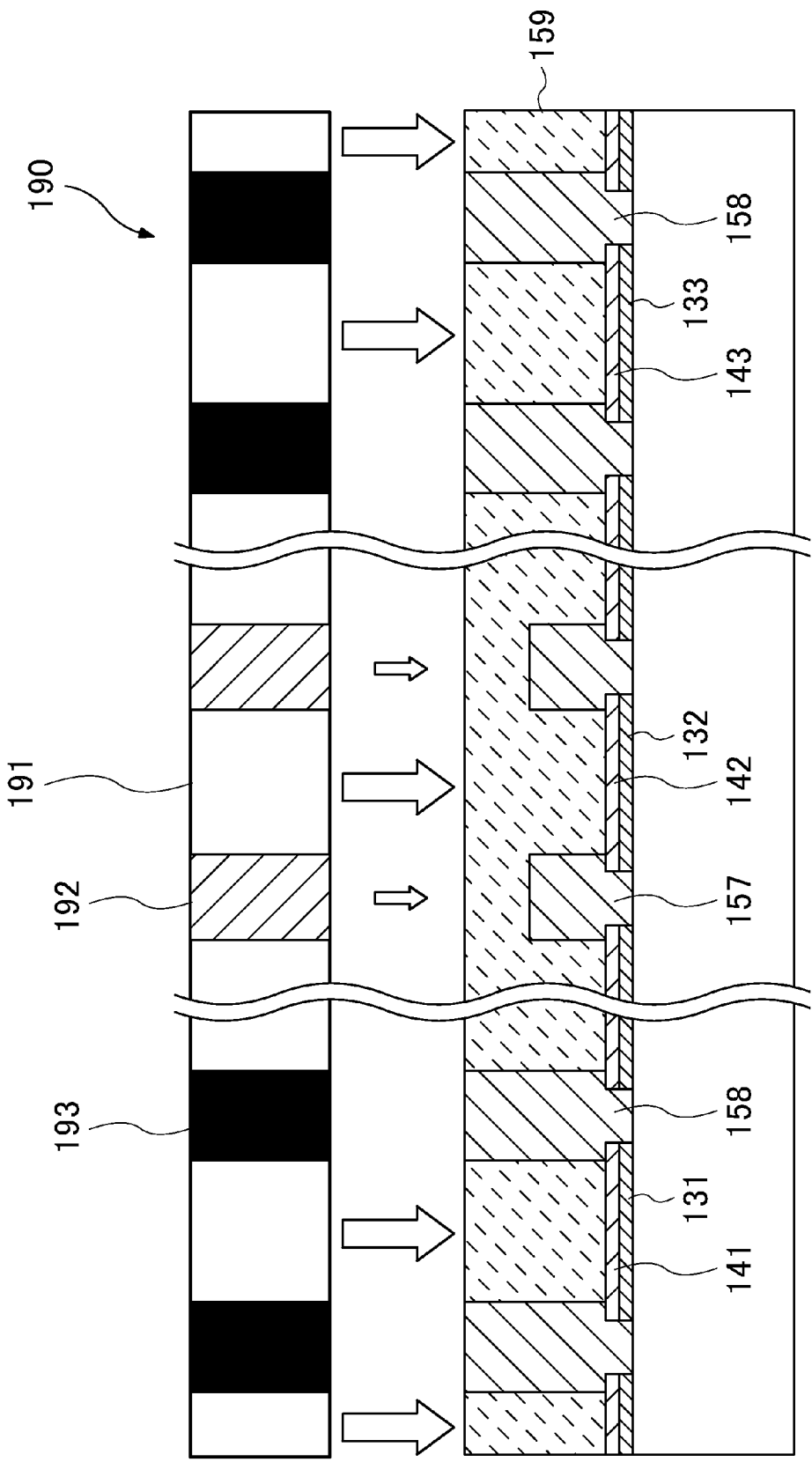
FIG. 5 shows a step of exposing a resin layer by use of a gradation mask in the method for producing the display device in embodiment 1 according to the present invention.
Figure 6:
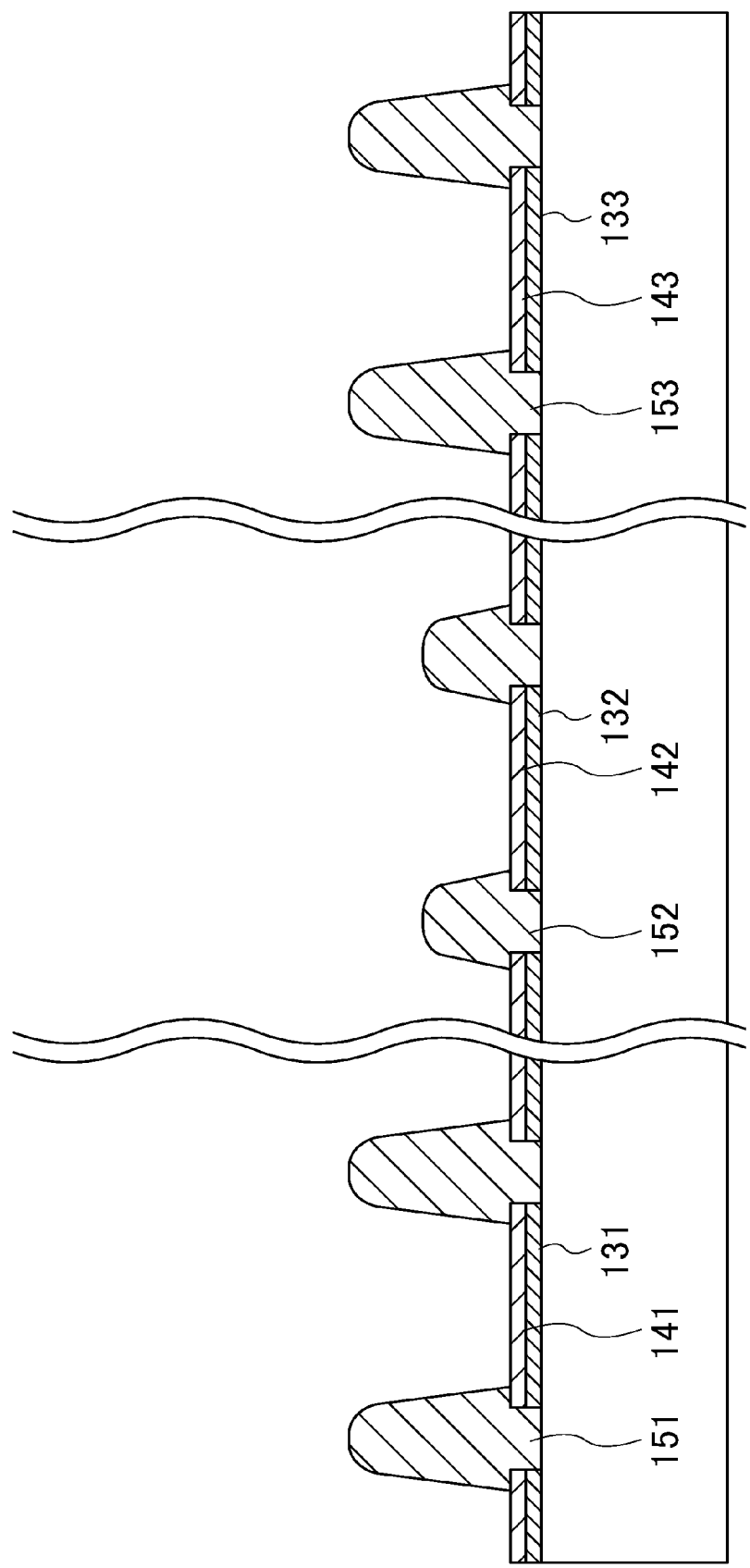
FIG. 6 shows a step of forming partitions in the method for producing the display device in embodiment 1 according to the present invention.

Next, a step of forming the partitions 150 (step S304) will be described. FIG. 5 shows a step of exposing a resin layer by use of a gradation mask in the method for producing the display device 10 in embodiment 1 according to the present invention. FIG. 6 shows a step of forming the partitions 150 in the method for producing the display device 10 in embodiment 1 according to the present invention. As shown in FIG. 6, the partitions 150 (partitions 151, 152 and 153) are formed so as to cover ends of the transistor layers 130 and the pixel electrodes 140 (step S304).

Now, with reference to FIG. 5, the method for forming the partitions 150 will be described in detail. First, a resin layer which is to be formed into the partitions 150 is formed of a resin material by spin coating or the like to have a desired thickness. The resin material is dissolved in a solvent, and the viscosity thereof is controllable by adjusting the concentration of the resin material or the concentration of an additive. The thickness of the layer is controllable by adjusting the rotation rate of the array substrate 100 at the time of application of the solvent containing the resin material to the array substrate 100. After being applied to the array substrate 100, the solvent is heated to be vaporized. Thus, a resin layer 159, which is to be formed into the partitions 150, is formed. The resin material may be, for example, a photosensitive resin. In the example described herein, a photosensitive resin is used as the resin material.

In order to pattern the resin layer 159 to form the partitions 150, an exposure and development process is performed by use of a photomask. In the example described herein, a gradation mask is used as the photomask. The gradation mask may be a gray-tone mask or a half-tone mask. A gray-tone mask has slits of a size equal to, or lower than, the resolution of an exposure device. The slits block a part of the light to realize intermediate exposure. A half-tone mask uses a "half-transmissive" film to realize intermediate exposure. Both of the gray-tone mask and the half-tone mask realize areas of three exposure levels, namely, an "exposed area", an "intermediate-exposed area" and a "non-exposed area" by one cycle of exposure. The layer of a photosensitive resin includes a plurality of areas different in the thickness after the development. The "intermediate-exposed area" having an exposure level different from the exposed area or the non-exposed area is formed by adjusting the amount of light to be passed or transmitted. As can be seen, at least three exposure levels can be realized by one cycle of exposure. In the example shown in FIG. 5, a positive photosensitive resin material is exposed by use of a half-tone mask.

As shown in FIG. 5, areas of the resin layer 159 corresponding to openings 191 of a half-tone mask 190 are entirely exposed in a depth direction thereof. Areas of the resin layer 159 corresponding to half-transmissive areas 192 of the half-tone mask 190 are exposed merely to a certain height from a surface thereof because the light directed thereto is weak. As a result, resin layers 157, which are thinner than the resin layer 159 are left unexposed. The height of the resin layers 157 is controllable by the transmittance of the half-transmissive areas 192 and the exposure conditions. Areas of the resin layer 159 corresponding to light blocking areas 193 of the half-tone mask 190 are not exposed because no light is directed thereto. As a result, resin layers 158 is formed.

The resin layer 159 exposed by use of the half-tone mask 190 as described above is developed. As a result, the part of the resin layer that is made soluble in a developer by being exposed is removed, and the resin layers 157 and 158 are left unexposed. In the areas of the resin layer 159 corresponding to the half-transmissive layers 192, a top part of the resin layer 159 is exposed and removed by development. Therefore, the height of the resin layers 157 and the height of the resin layers 158 are different from each other after the development. In the process shown in FIG. 5, the resin layers having different heights are formed by use of a half-tone mask. The present invention is not limited to performing such a process. The resin layers having different heights may be formed by use of a gray-tone mask or any other type of gradation mask.

The resin layer 159 exposed by the method shown in FIG. 5 is exposed and heated, and thus the partitions 150, as shown in FIG. 6, located to demarcate the pixels and cover the ends of the pixel electrodes 140 are obtained. The resin layers 158 correspond to the partitions 151 and 153, and the resin layers 157 correspond to the partitions 152. Namely, the height of the partitions 152 is determined by the amount of light transmitted through the half-transmissive areas 192. As can be seen, the method shown in FIG. 5 and FIG. 6 allows the partitions 151 and 153, and the partitions 152, having different heights to be formed in one step by use of a gradation mask.

Figure 7:
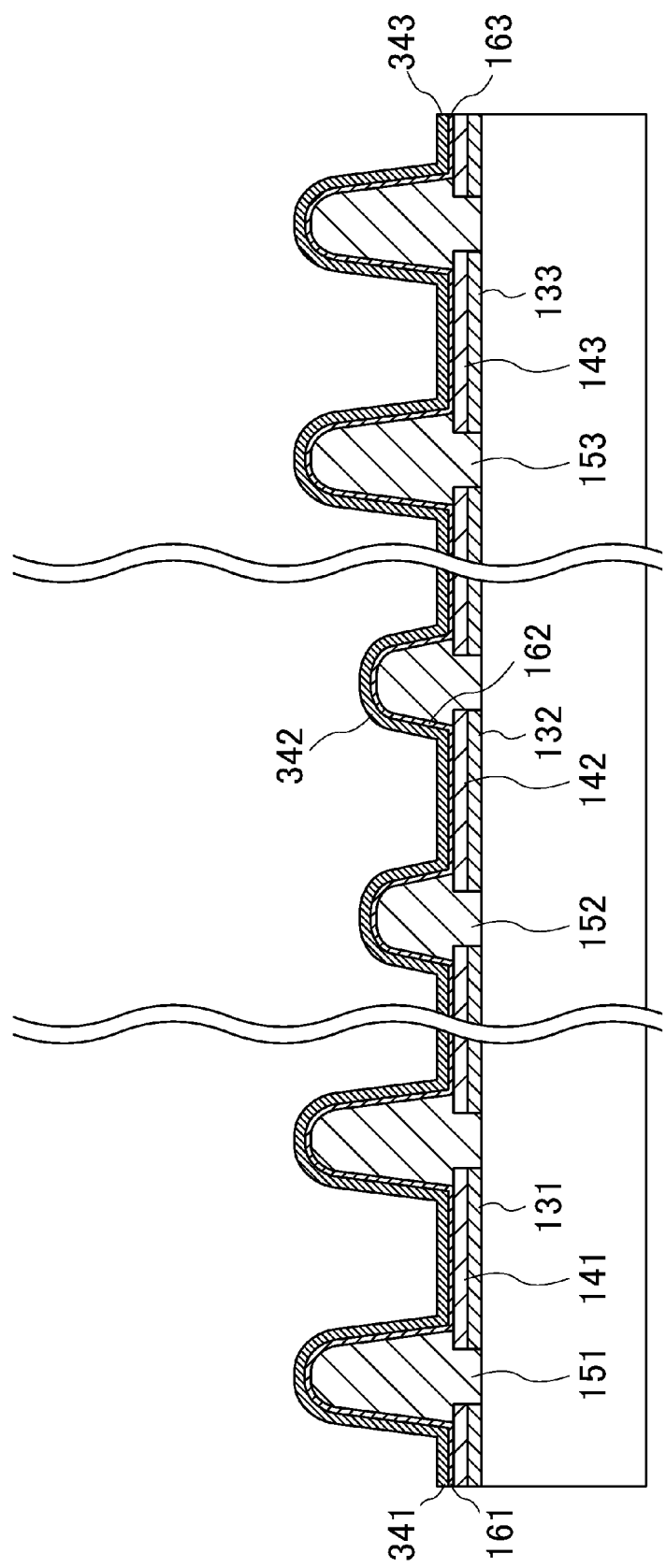
FIG. 7 shows a step of forming a light emitting layer and a common electrode in the method for producing the display device in embodiment 1 according to the present invention.

FIG. 7 shows a step of forming the light emitting layer 160 and the common electrode 340 in the method for producing the display device 10 in embodiment 1 according to the present invention. As shown in FIG. 7, after the partitions 150 are formed, the light emitting layer 160 (light emitting layers 161, 162 and 163) formed of a single film or a plurality of films and the common electrode 340 (common electrodes 341, 342 and 343) are formed in the display area (step S305). In the case where the light emitting layer 160 emits white light, the light emitting layer 160 does not need to be patterned and may be formed in the entirety of the display area. In the case where being formed of a low molecular weight material, the light emitting layer 160 may be formed by vapor deposition by use of a metal mask having an opening positionally corresponding to the display area.

In this step, the partitions 150 may be used as spacers (members abutting the metal mask). In the case where being formed of a high molecular weight material, the light emitting layer 160 may be formed of ink jetting or the like. In the case where RGB light emitting elements are to be formed respectively in the pixels, the areas of the light emitting layer 160 emitting light of the RGB colors are formed in the respective pixels. In the case where being formed of a low molecular weight material, the areas of the light emitting layer 160 emitting light of different colors are formed in the respective pixels by use of, for example, a metal mask having a microscopic pattern. Especially, in the case where the areas of the light emitting layer 160 emitting light of different colors on a pixel-by-pixel basis are to be formed by use of a metal mask, the partitions 150 may be used as the spacers between the metal mask and the elements on the side of the array substrate 100 above which the light emitting layer 160 is to be formed. Thus, the metal mask and the array substrate 100 are made close to each other. As a result, the light emitting layer 160 accurately reflecting the pattern of the metal mask is formed.

The common electrode 340 may be formed by use of an ion plating device, a counter target-type sputtering device or the like. In the case where the ion plating device or the counter target-type sputtering device is used, plasma does not directly contact the elements on the side of the array substrate 100. Therefore, damages to the light emitting layer 160 is suppressed. According to an alternative method for forming the common electrode 340, a thin metal film is formed on the light emitting layer 160 by vapor deposition, and the common electrode 340 is formed on the thin metal film by sputtering. In this case, the thin metal film acts as a protective layer. Therefore, even if the common electrode 340 is formed by sputtering, damages to the light emitting layer 160 is suppressed.

Figure 8:
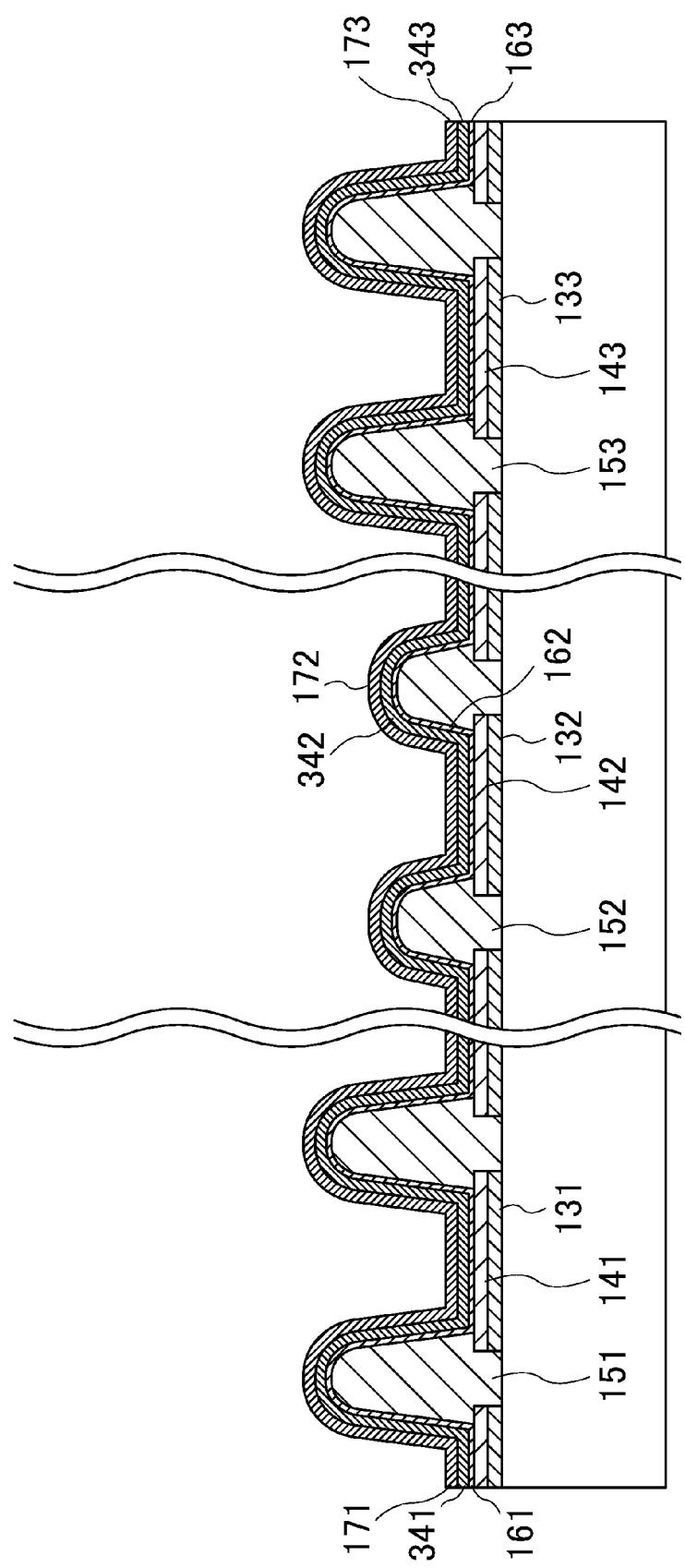
FIG. 8 shows a step of forming a protective layer in the method for producing the display device in embodiment 1 according to the present invention.

FIG. 8 shows a step of forming the protective layer 170 in the method for producing the display device 10 in embodiment 1 according to the present invention. As shown in FIG. 8, after the light emitting layer 160 and the common electrode 340 are formed, the protective layer 170 (protective layers 171, 172 and 173) are formed so as to cover the light emitting layer 160 (step S306). Since the protective layer 170 is formed after the light emitting layer 160 is formed, the protective layer 170 is preferably formed at a temperature equal to, or lower than, the glass transition temperature of the organic EL layer used for the light emitting layer 160.

The protective layer 170 formed of an inorganic material as described above may include an area having a low density in a stepped part below the protective layer 170 (e.g., border between the pixel electrodes 140 and the partitions 150). Such an area having a low film density may be contaminated with moisture or impurities, resulting in fluctuation of the transistor characteristics or deterioration of the light emitting layer 160. Therefore, it is important that the protective layer 170 is formed to have a sufficient coverage.

Figure 9:
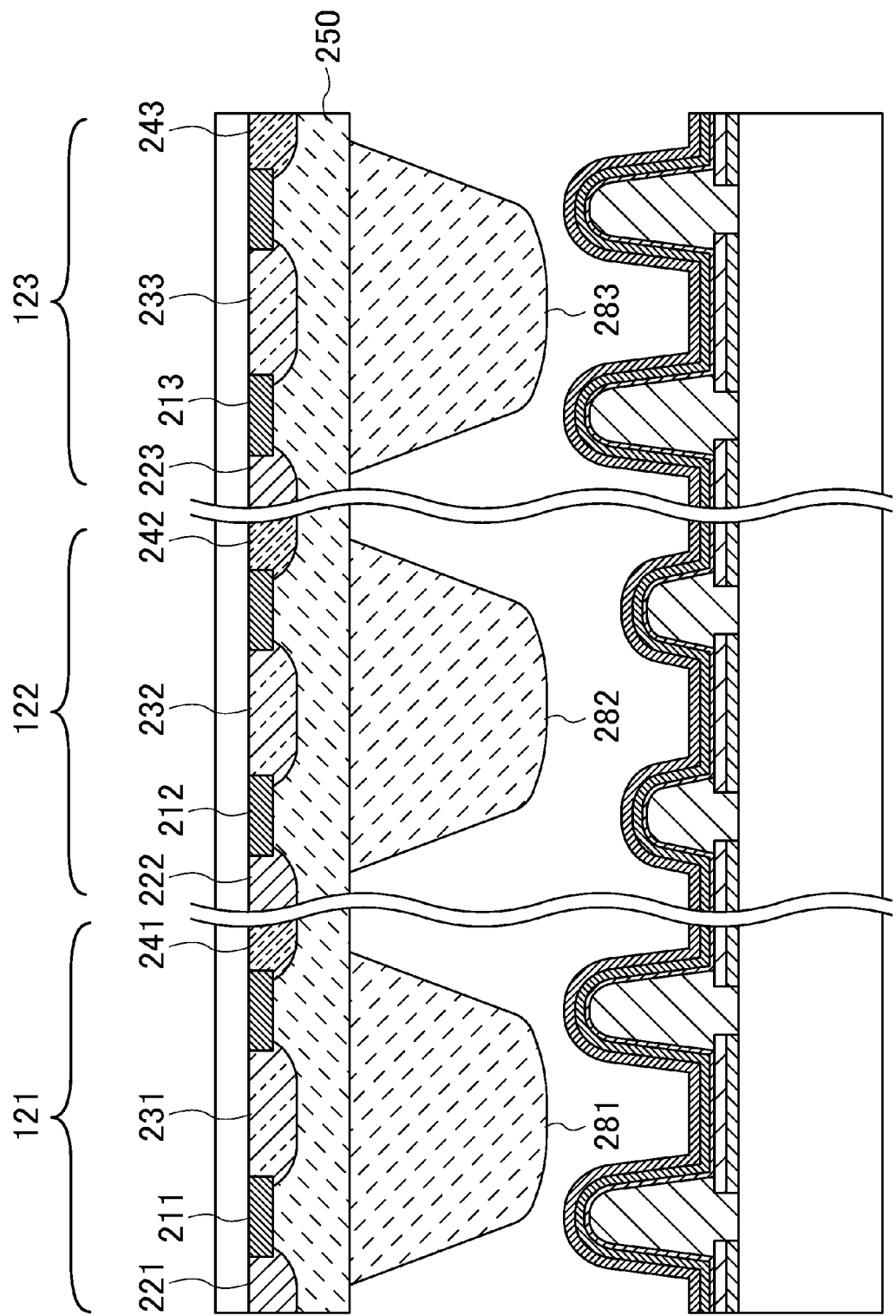
FIG. 9 shows a step of forming a filler on the side of a counter substrate in the method for producing the display device in embodiment 1 according to the present invention.

Now, with reference to FIG. 9, a method for producing the elements on the side of the counter substrate 200 will be described. FIG. 9 shows a step of forming a filler 280 on the side of the counter substrate 200 in the method for producing the display device 10 in embodiment 1 according to the present invention. As shown in FIG. 9, the array substrate 200 is prepared (step S311). On the counter substrate 200, the light blocking layer 210 (light blocking layers 211, 212 and 213) are formed so as to have openings positionally corresponding to the pixels (step S312). The colors filters (B) 220 (color filters (B) 221, 222 and 223), the colors filters (G) 230 (color filters (G) 231, 232 and 233), and the colors filters (R) 240 (color filters (R) 241, 242 and 243) are formed on the counter substrate 200 and the light blocking layer 210 in correspondence with the pixels of respective colors (step S312). The overcoat layer 250 is formed so as to cover the light blocking layer 210 and the color filters 220, 230 and 240 (step S313). Although not shown in FIG. 9, the sealing member is formed on an area of the overcoat layer 250 corresponding to a peripheral area of the counter substrate 200 (step S314). The filler 280 (fillers 281, 282 and 283) on an area of the overcoat layer 250 corresponding to the display area (step S315). A method for forming the filler 280 on the counter substrate 200 and a method for assembling the array substrate 100 and the counter substrate 200 will be described in detail later.

In the example shown in FIG. 9, the color filters 220, 230 and 240 are formed on the light blocking layer 210. The present invention is not limited to this. The color filters 220, 230 and 240 may be formed first and then the light blocking layer 210 may be formed thereon. Alternatively, another layer may be located between the counter substrate 200 and the light blocking layer 210, or between the counter substrate 200 and the color filters 220/230/240. Still alternatively, another layer may be located between the light blocking layer 210 and the color filters 220/230/240. The color filters are provided in at least three colors as the color filters 220, 230 and 240, and the light blocking layer 210 may be located between any of the three types of color filters. For example, the color filters (R) 240 and the color filters (G) 230 may be located on the counter substrate 200 and the light blocking layer 210 may be located on the color filters (R) 240 and the color filters (G) 230, whereas the color filters (B) 220 may be located on the light blocking layer 210.

The filler 280 may be formed of a resin material. A delay-curable resin material that is gradually cured by ultraviolet or heat is usable for the filler 280. For example, the filler 280 in the state shown in FIG. 9 is irradiated with ultraviolet, and the array substrate 100 and the counter substrate 200 are assembled together before the filler 280 is cured (step S321).

Figure 10:
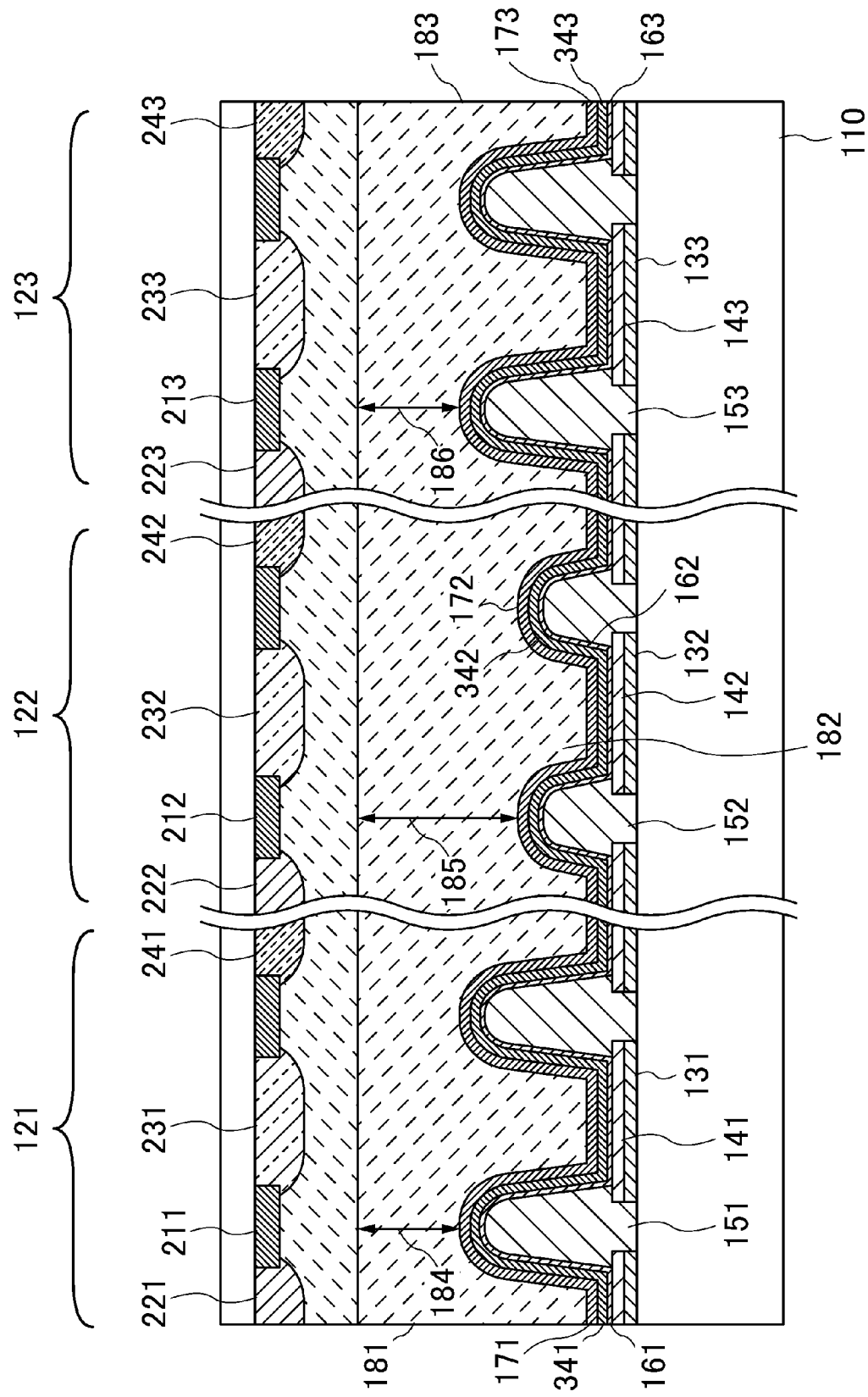
FIG. 10 shows a step of assembling the array substrate and the counter substrate in the method for producing the display device in embodiment 1 according to the present invention.

FIG. 10 shows a step of assembling the array substrate 100 and the counter substrate 200 in embodiment 1 according to the present invention. When the array substrate 100 and the counter substrate 200 are assembled together in step S321, the filler 280 in lumps an uncured state shown in FIG. 9 is formed into the filler 180 in a cured layer shown in FIG. 10. The filler 182 in the second area 122 is formed to be thicker than the fillers 181 and 183 in the first area 121 and the third area 123. The partitions 152 in the second area 122 are formed to be lower than the partitions 151 and 153 in the first area 121 and the third area 123. Therefore, the filler 182 has substantially the same height as that of the fillers 181 and 183. Namely, the distance between the light emitting layer 160 and the counter substrate 200 is kept uniform in all of the first area 121, the second area 122 and the third area 123.

As described above, the partitions having different heights are formed in one step by use of a gradation mask, so that the production process is shortened. In this manner, a display device suppressing non-uniform display is produced at lower cost.

[Method for Forming the Display Device 10 in Embodiment 1 by Assembling]

With reference to FIG. 11 through FIG. 15, a method for forming the display device 10 in embodiment 1 according to the present invention by assembling will be described in detail. Especially, a method for forming the sealing member 110 and the filler 120 on the counter substrate 200, and a method for assembling the array substrate 100 and the counter substrate 200 will be described. In each of FIG. 11 through FIG. 15, a plan view is shown in an upper part of the paper sheet, and a cross-sectional view taken along line E-F in the plan view is shown in a lower part of the paper sheet. In FIG. 11 through FIG. 15, the transistor layers, the pixel electrodes, the light emitting layer and the protective layer on the array substrate 100 are omitted for the sake of convenience. The light blocking layer, the color filters and the overcoat layer on the counter substrate 200 are omitted for the sake of convenience.

FIG. 11 shows a step of applying the sealing member 110 to the counter substrate 200 as a part of the step of assembling the array substrate 100 and the counter substrate 200 to form the display device 100 in embodiment 1 according to the present invention. The sealing member 110 bonding the array substrate 110 and the counter substrate 200 is formed on the peripheral area of the counter substrate 200. The sealing member 110 has a thickness appropriately adjustable in the range of, for example, 50 μm or greater and 300 μm or less. The sealing member 110 may contain particles acting as spacers. The particles may have a diameter of 2 μm or greater and 10 μm or less. The height of the sealing member 110 and the diameter of the particles may be outside the above-described ranges and may be appropriately adjustable in accordance with the purpose of the display device 10. In the example described below, the thickness of the sealing member 110 is about 150 μm, and the diameter of the particles is about 4.5 μm.

FIG. 12 shows a step of applying the filler 280 to the counter substrate 200 as a part of the step of assembling the array substrate 100 and the counter substrate 200 to form the display device 100 in embodiment 1 according to the present invention. As shown in FIG. 12, the filler 280 is located in lumps in a plurality areas on the counter substrate 200. The filler 280 may be positionally adjusted applied such that in the state where the array substrate 100 and the counter substrate 200 are assembled together, the filler 182 positionally corresponding to the partitions 152 in the second area 122 is thicker than the filler 181 positionally corresponding to the partitions 151 in the first area 121. For example, adjacent lumps of the filler 280 may be located at an equal interval. The filler 280 may be formed of a delay-curable resin material that is gradually cured by ultraviolet or heat. In this example, the lumps of the filler 280 has a height of about 200 μm immediately after being dripped.

FIG. 13 shows a step of assembling the array substrate 100 and the counter substrate 200 in vacuum as a part of the step of assembling the array substrate 100 and the counter substrate 200 to form the display device 100 in embodiment 1 according to the present invention. Before the assembling step (before the state shown in FIG. 12), the filler 280 is irradiated with ultraviolet. Before the filler 280 is cured, the array substrate 100 and the counter substrate 200 are positioned with respect to each other and assembled together. The assembling step of the array substrate 100 and the counter substrate 200 is performed in vacuum. The array substrate 100 and the counter substrate 200 may be further positioned with respect to each other in the state shown in FIG. 13.

FIG. 14 shows a step of pressing the array substrate 100 and the counter substrate 200 to each other to expand the filler 280 as a part of the step of assembling the array substrate 100 and the counter substrate 200 to form the display device 100 in embodiment 1 according to the present invention. The array substrate 100 and the counter substrate 200 are pressed to each other in the state shown in FIG. 13, so as to become closer to each other. Thus, the filler 280 and the sealing member 110 shown in FIG. 13 are expanded in a direction parallel to the surfaces of the two substrates 100 and 200. As a result, the sealing member 110 that seals the substrates 100 and 200 along the peripheral area, and the filler 180 in a layer that fills the area surrounded by the two substrates 100 and 200 and the sealing member 110, are formed. The step of pressing the array substrate 100 and the counter substrate 200 shown in FIG. 14 is also performed in vacuum. Since the substrates 100 and 200 are pressed in vacuum, generation of air bubbles, which would otherwise be caused between the substrates 100 and 200 while the filler 280 in the lumps is expanded to form the filler 180 in the layer, is suppressed. As a result of the substrates 100 and 200 being pressed, the thickness of the sealing member 110 is decreased from about 150 μm to about 100 μm.

FIG. 15 shows a step of pressing the array substrate 100 and the counter substrate 200 to each other at an atmospheric pressure as a part of the step of assembling the array substrate 100 and the counter substrate 200 to form the display device 100 in embodiment 1 according to the present invention. The atmosphere of the assembled substrates 100 and 200 in the state shown in FIG. 14, namely, vacuum, is changed to the atmospheric pressure. Therefore, the array substrate 100 and the counter substrate 200 are pressed at the atmospheric pressure, and the sealing member 110 and the filler 180 are compressed to be still thinner. As a result of the array substrate 100 and the counter substrate 200 being pressed at the atmospheric pressure, the thickness of the sealing member 110 is decreased until the sealing member 110 is supported by the particles contained therein. Namely, the thickness of the sealing member 110 is decreased from about 100 μm to about 4.5 μm.

As described above, the array substrate 100 and the counter substrate 200 are pressed to each other at the atmospheric pressure after being assembled together. Thus, the substrates 100 and 200 are pressed by a uniform force in the planar direction of the substrates. This suppresses the distribution of thickness of the filler 180 from being caused by the non-uniformity of the magnitude of force pressing the substrates 100 and 200.

<Comparative Example>

Figure 16:
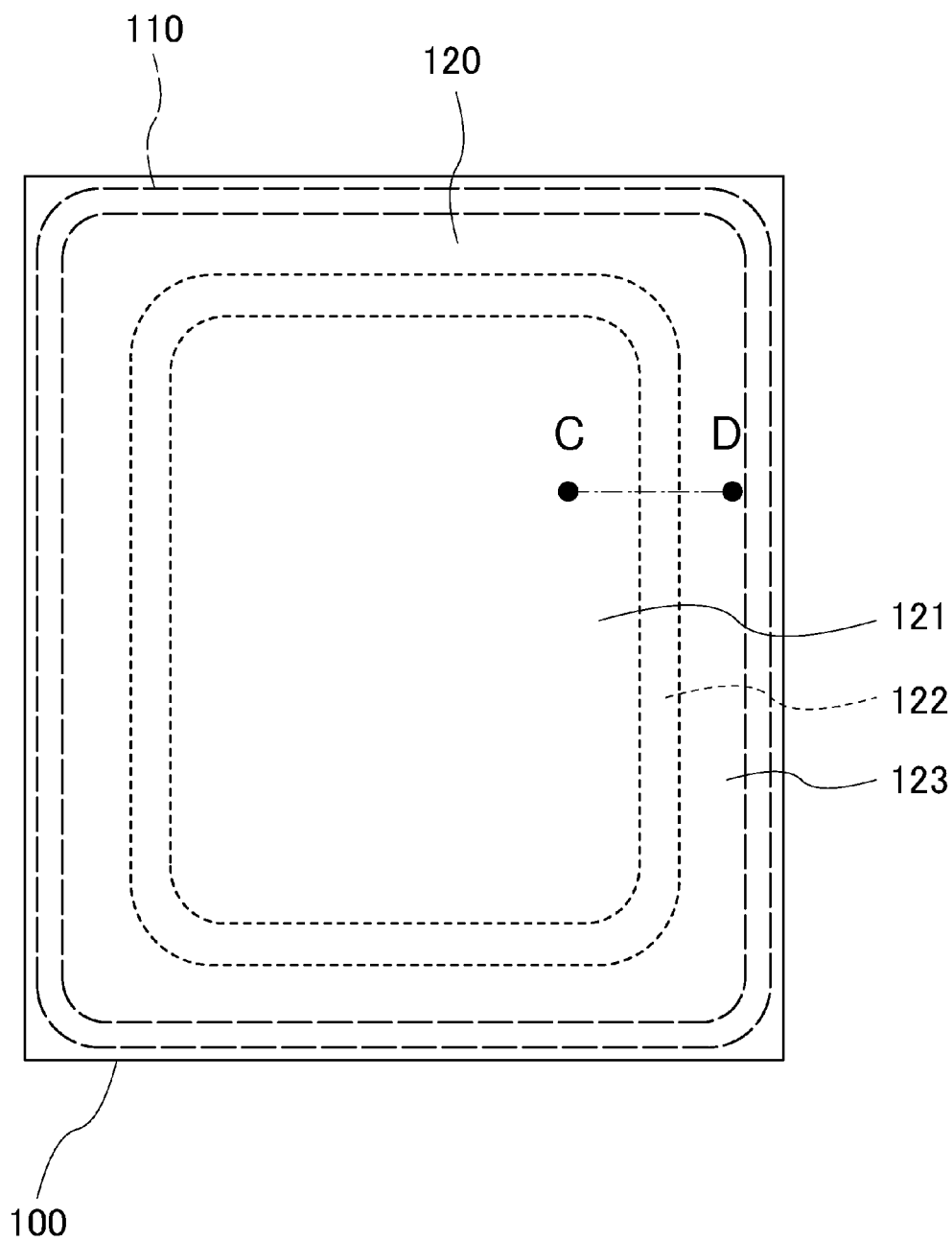
FIG. 16 is a plan view of a display device in a comparative example.

Now, with reference to FIG. 16 and FIG. 17, a comparative example to embodiment 1 according to the present invention will be described. FIG. 16 is a plan view of a display device 11 in the comparative example. In the plan view, the structure of the display device 11 in the comparative example is the same as the structure of the display device 10 in embodiment 1 shown in FIG. 1, and will not be described in detail. The structure of the display device 11 in the comparative example is different from the structure of the display device 10 in the cross-sectional view. The filler 120 in the second area 122 is thicker than the filler 120 in the first area 121 and the third area 123.

Figure 17:
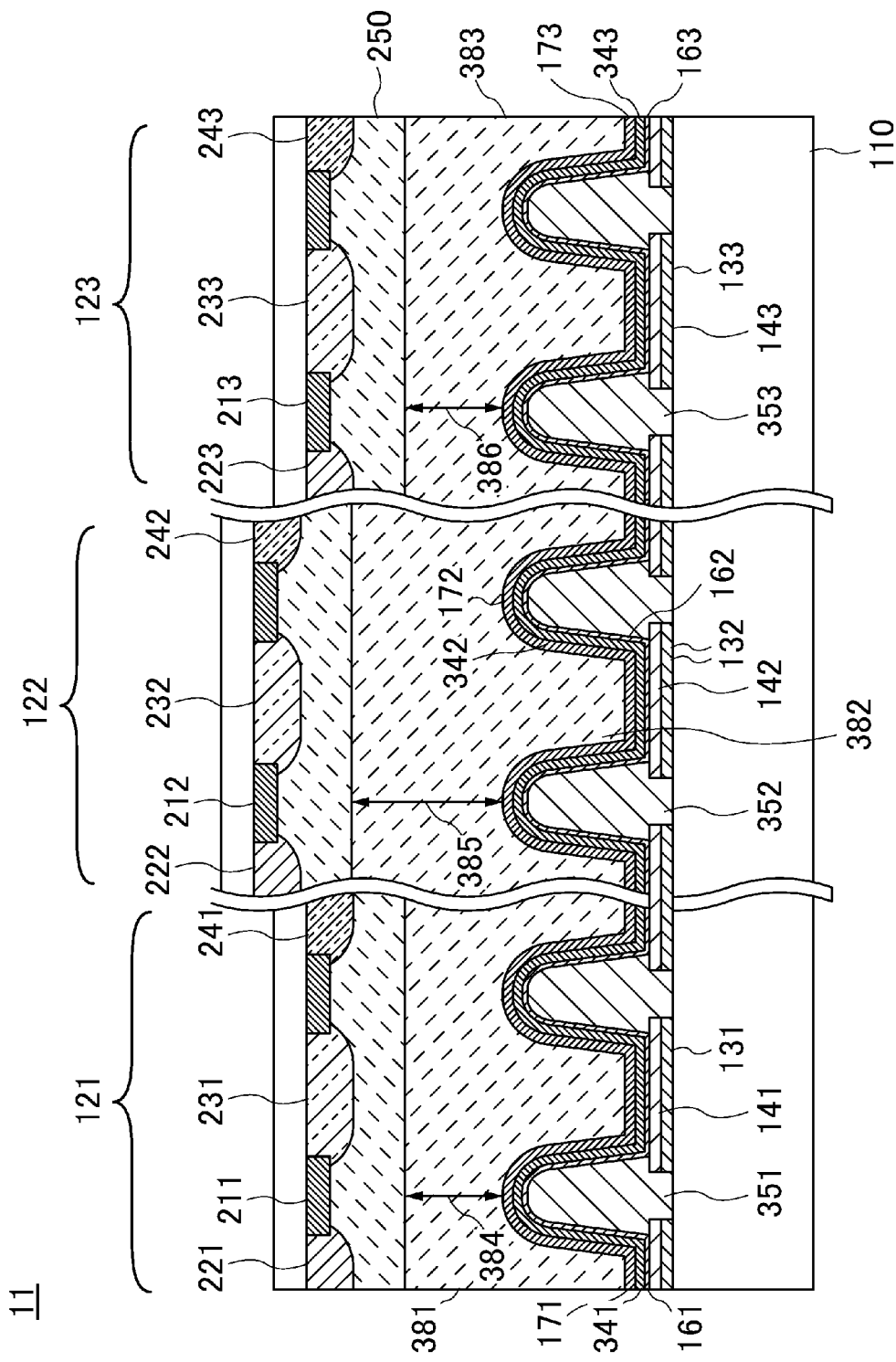
FIG. 17 is a cross-sectional view of the display device in the comparative example, taken along line C-D in FIG. 16.

FIG. 17 is a cross-sectional view of the display device 11 in the comparative example, taken along line C-D in FIG. 16. Unlike in FIG. 2, in FIG. 17, partitions 352 in the second area 122 have a height substantially the same as that of partitions 351 in the first area 121 and partitions 353 in the third area 123. In FIG. 17, the partitions 351 through 353 have substantially the same height, and a thickness 385 of a filler 382 in the second area 122 is greater than a thickness 384 of a filler 381 in the first area 121 and a thickness 386 of a filler 383 in the third area 123. As a result, the position of a surface of the filler 382 (position of a surface in contact with the overcoat layer 250) is at a higher level than the position of surfaces of the fillers 381 and 383. Namely, the length of the optical path from the light emitting layer 160 generating the light to the rear surface of the counter substrate 200 at which the light is output to the outside of the display device 11 is different between the second area 122 and the first and third areas 121 and 123. Therefore, in the display device 11 in the comparative example, non-uniform display is caused due to the difference in the length of the optical path.

As described above, in the display device 11 in the comparative example, non-uniform display is caused due to the difference in the thickness of the filler between the second area 122 and the first and third areas 121 and 123. By contrast, in the display device 10 according to the present invention, the partitions have different heights in accordance with the different thicknesses of the fillers as described above in embodiment 1. Thus, the non-uniform display is suppressed.

The present invention is not limited to the above-described embodiment, and may be appropriately modified without departing from the gist thereof.

What is claimed is:

1. A display device comprising:
   a first substrate having a display region and a peripheral region surrounding the display region, the display region having a first region and a second region surrounding the first region, and having a first ring shape;
   a plurality of first red pixels arranged in the first region;
   a plurality of first green pixels arranged in the first region;
   a plurality of first blue pixels arranged in the first region;
   a plurality of second red pixels arranged in the second region;
   a plurality of second green pixels arranged in the second region;
   a plurality of second blue pixels arranged in the second region;
   a first insulation partition arranged in the first region;
   a second insulation partition having a second height smaller than a first height of the first insulation partition, the second insulation partition being arranged in the second region and surrounding the first region;
   a filler; and
   a second substrate, wherein
   each of the first red pixels, the second red pixels, the first green pixels, the second green pixels, the first blue pixels, and the second blue pixels includes an anode electrode, an organic emitting layer on the anode electrode, and a cathode electrode on the organic emitting layer,
   the first insulation partition covers a first peripheral area of the anode electrode of each of the first red pixels, the first green pixels, and the first blue pixels,
   the second insulation partition covers a second peripheral area of the anode electrode of each of the second red pixels, the second green pixels, and the second blue pixels,
   the filler covers the first insulation partition and the second insulation partition, and
   the second substrate covers the filler.

2. The display device according to claim 1, further comprising:
   a plurality of third red pixels;
   a plurality of third green pixels;
   a plurality of third blue pixels; and
   a third insulation partition having a third height larger than the second height, the third insulation partition being arranged in the third region and surrounding the second region;
   wherein
   the first substrate further having a third region surrounding the second region and having a second ring shape,
   the plurality of third red pixels, the plurality of third green pixels, and the plurality of third blue pixels arranged in the third region
   each of the third red pixels, the third green pixels, and the third blue pixels includes the anode electrode, the organic emitting layer on the anode electrode, and the cathode electrode on the organic emitting layer,
   the third insulation partition covers a third peripheral area of the anode electrode of each of the third red pixels, the third green pixels, and the third blue pixels, and
   the filler covers the third insulation partition.

3. The display device according to claim 2, wherein a first thickness of the filler directly above the first insulation partition and the third insulation partition is thinner than a second thickness of the filler directly above the second insulation partition.

4. The display device according to claim 3, further comprising a sealing material surrounding the filler and being arranged between the first substrate and the second substrate in the peripheral region.

5. The display device according to claim 4, wherein each of the second insulation partition and the third insulation partition is arranged along the sealing material.

* * * * *